United States Patent
Yang et al.

(10) Patent No.: US 12,205,657 B2
(45) Date of Patent: Jan. 21, 2025

(54) HYBRID SMART VERIFY FOR QLC/TLC DIE

(71) Applicant: SanDisk Technologies LLC, Addison, TX (US)

(72) Inventors: Xiang Yang, Santa Clara, CA (US); Henry Chin, Fremont, CA (US); Erika Penzo, San Jose, CA (US); Muhammad Masuduzzaman, Milpitas, CA (US)

(73) Assignee: SanDisk Technologies LLC, Austin, TX (US)

( * ) Notice: Subject to any disclaimer, the term of this patent is extended or adjusted under 35 U.S.C. 154(b) by 245 days.

(21) Appl. No.: 17/895,412

(22) Filed: Aug. 25, 2022

(65) Prior Publication Data

US 2024/0071524 A1  Feb. 29, 2024

(51) Int. Cl.
*G11C 16/34* (2006.01)
*G11C 16/10* (2006.01)
*G11C 16/14* (2006.01)

(52) U.S. Cl.
CPC ........ *G11C 16/3459* (2013.01); *G11C 16/102* (2013.01); *G11C 16/14* (2013.01); *G11C 16/3404* (2013.01)

(58) Field of Classification Search
CPC .................................................. G11C 16/3459
USPC ..................................................... 365/185.22
See application file for complete search history.

(56) References Cited

U.S. PATENT DOCUMENTS

| | | | |
|---|---|---|---|
| 7,073,103 B2 | 7/2006 | Gongwer et al. | |
| 8,873,293 B1* | 10/2014 | Ou ..................... | G11C 16/0483 |
| | | | 365/185.17 |
| 9,142,298 B2* | 9/2015 | Dong ................. | G11C 16/0483 |
| 9,564,226 B1* | 2/2017 | Dunga ............... | G11C 16/3459 |
| 10,014,063 B2 | 7/2018 | Tseng et al. | |
| 10,217,515 B2 | 2/2019 | Goda et al. | |
| 10,395,739 B2 | 8/2019 | Kondo | |
| 10,573,397 B1* | 2/2020 | Sehgal ............... | G11C 11/5628 |
| 11,244,735 B2 | 2/2022 | Zhang et al. | |
| 11,250,920 B2 | 2/2022 | Yabe | |
| 2004/0109362 A1 | 6/2004 | Gongwer et al. | |

(Continued)

FOREIGN PATENT DOCUMENTS

| | | |
|---|---|---|
| JP | 2009054246 A | 3/2009 |
| JP | 2009514138 A | 4/2009 |

(Continued)

*Primary Examiner* — Anthan Tran
(74) *Attorney, Agent, or Firm* — Vierra Magen Marcus LLP

(57) ABSTRACT

Technology is disclosed herein for smart verify in a memory system that has a four bit per cell program mode (or X4 mode) and also a three bit per cell program mode (or X3 mode). The X3 mode uses a three-bit gray code that is based on a four-bit gray code of the X4 mode. The memory system skips verify of states in the X3 mode, while using a considerable portion of the programming logic from the X4 mode. In one X3 mode the memory system skips B-state verify while the number of memory cells having a Vt above an A-state verify voltage is below a threshold. In one X3 mode the memory system determines whether to skip verify for a first set of data states based on a first test and determines whether to skip verify for a second set of data states based on a second test.

9 Claims, 35 Drawing Sheets

(56) References Cited

U.S. PATENT DOCUMENTS

| | | |
|---|---|---|
| 2015/0078080 A1 | 3/2015 | Lee |
| 2021/0257037 A1 | 8/2021 | Zhang et al. |

FOREIGN PATENT DOCUMENTS

| | | | |
|---|---|---|---|
| JP | 2010067291 | A | 3/2010 |
| JP | 2014175031 | A | 9/2014 |
| KR | 20180062158 | A | 6/2018 |
| KR | 20190102837 | A | 9/2019 |
| KR | 20220076974 | A | 6/2022 |
| TW | I543170 | B | 7/2016 |

* cited by examiner

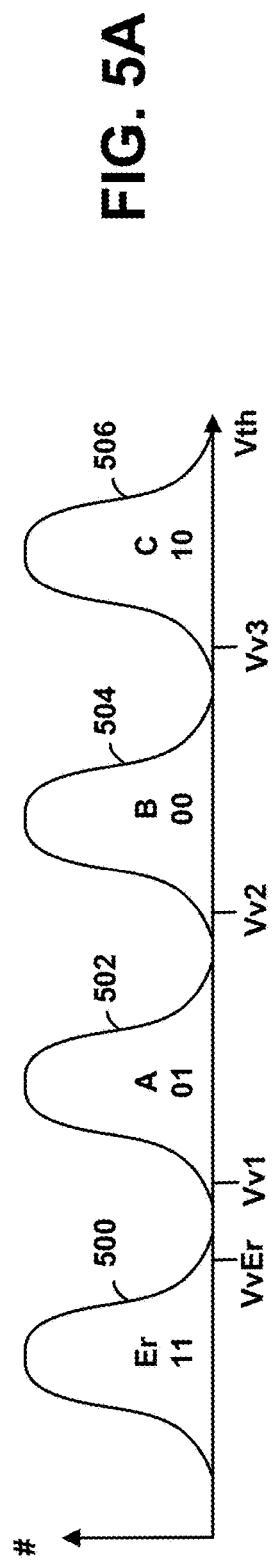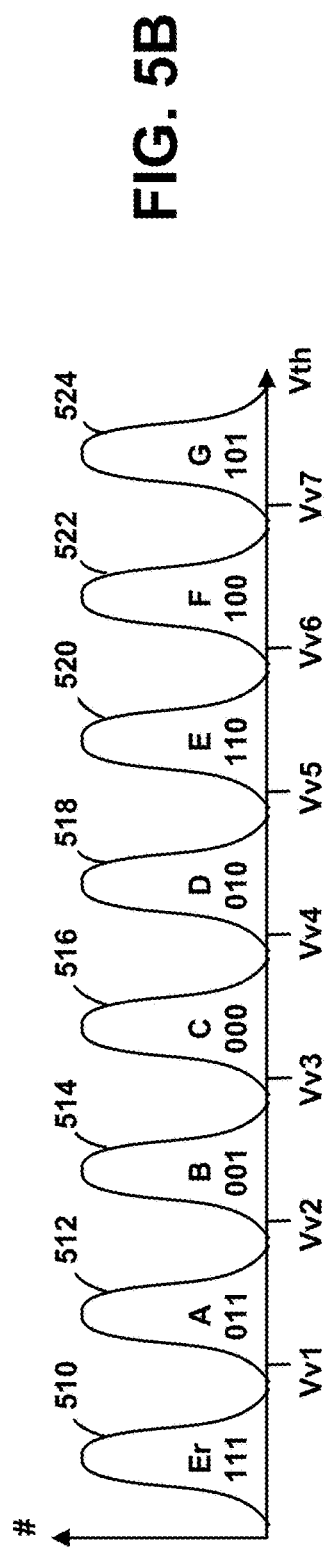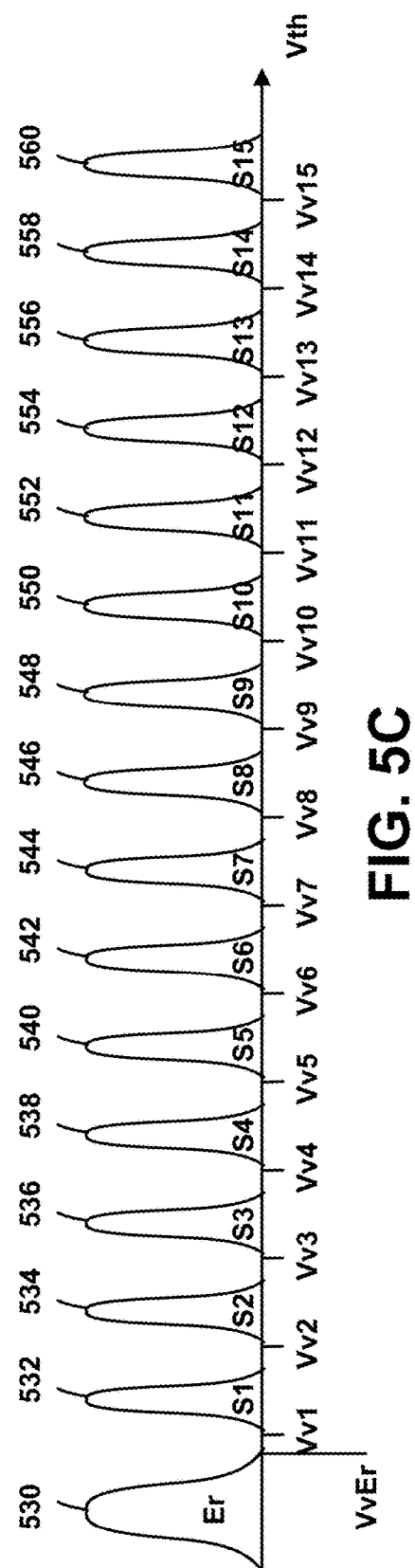

FIG. 7A1 — 700a1

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 7A2 — 700a2

| | "Er" S0 | "A" S1 | "B" S8 | "C" S9 | "D" S12 | "E" S13 | "F" S14 | "G" S15 |
|---|---|---|---|---|---|---|---|---|
| TP | 1 | 0 | 0 | 0 | 0 | 1 | 1 | 1 |
| UP | 1 | 1 | 1 | 1 | 1 | 1 | 1 | 1 |
| MP | 1 | 1 | 1 | 0 | 0 | 0 | 0 | 1 |
| LP | 1 | 1 | 0 | 0 | 1 | 1 | 0 | 0 |

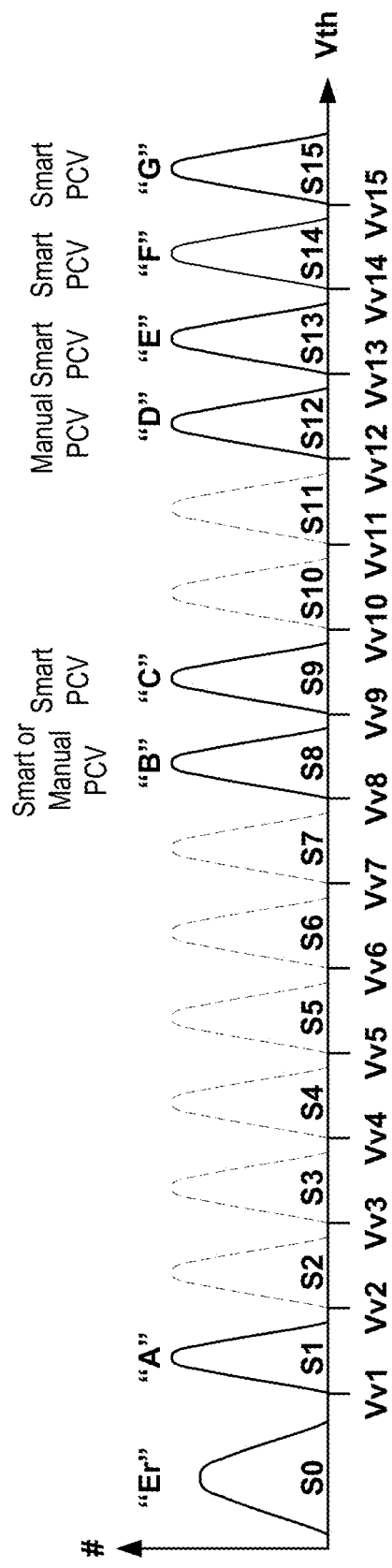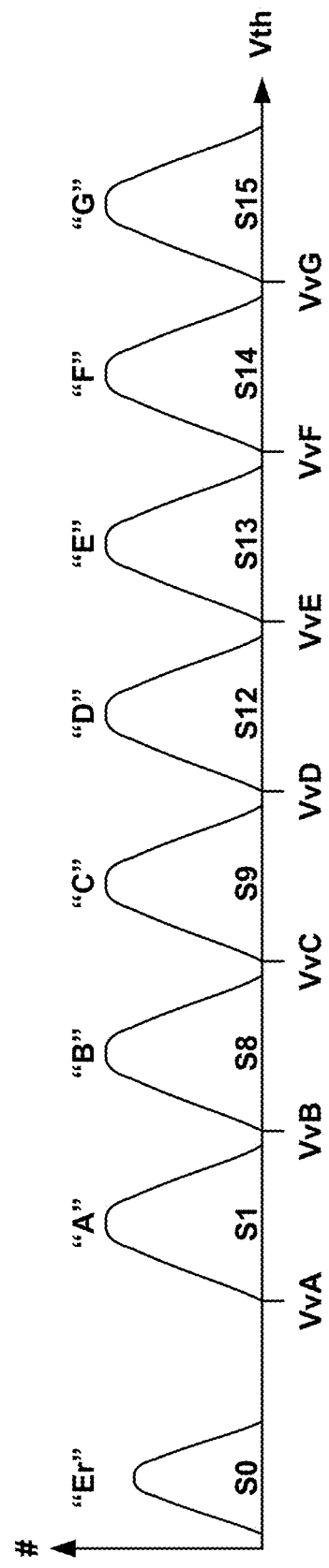
FIG. 7A3
FIG. 7A4

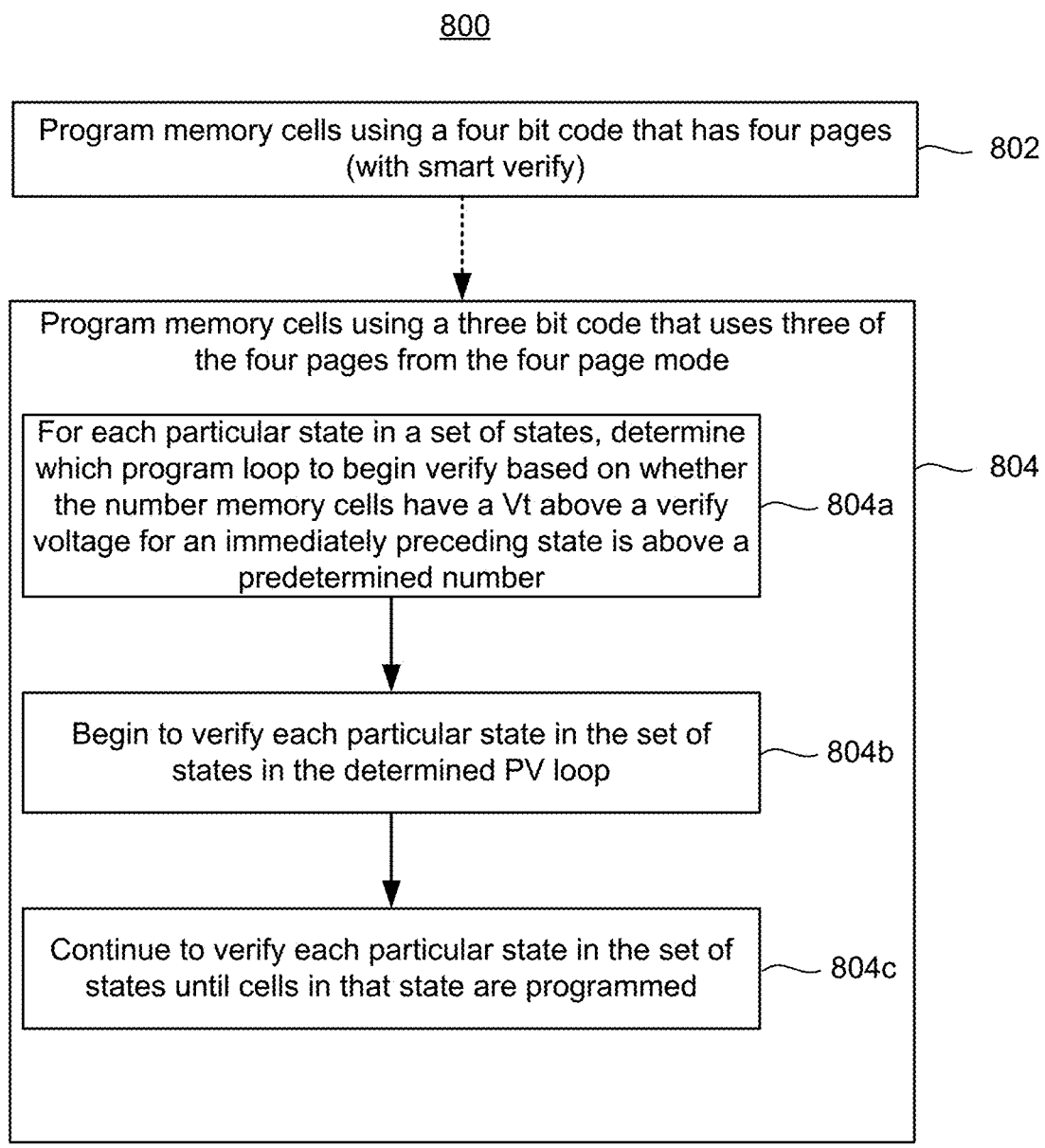

FIG. 16B1 — 1600b1

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 16B2 — 1600b2

| | "Er" | "A" | "B" | "C" | "D" | "E" | "F" | "G" |
|---|---|---|---|---|---|---|---|---|
| | S2 | S3 | S4 | S5 | S6 | S7 | S10 | S11 |
| TP | 0 | 1 | 1 | 1 | 1 | 0 | 0 | 0 |
| UP | 0 | 0 | 0 | 0 | 0 | 0 | 0 | 0 |
| MP | 1 | 1 | 0 | 0 | 1 | 1 | 0 | 0 |
| LP | 1 | 1 | 1 | 0 | 0 | 0 | 0 | 1 |

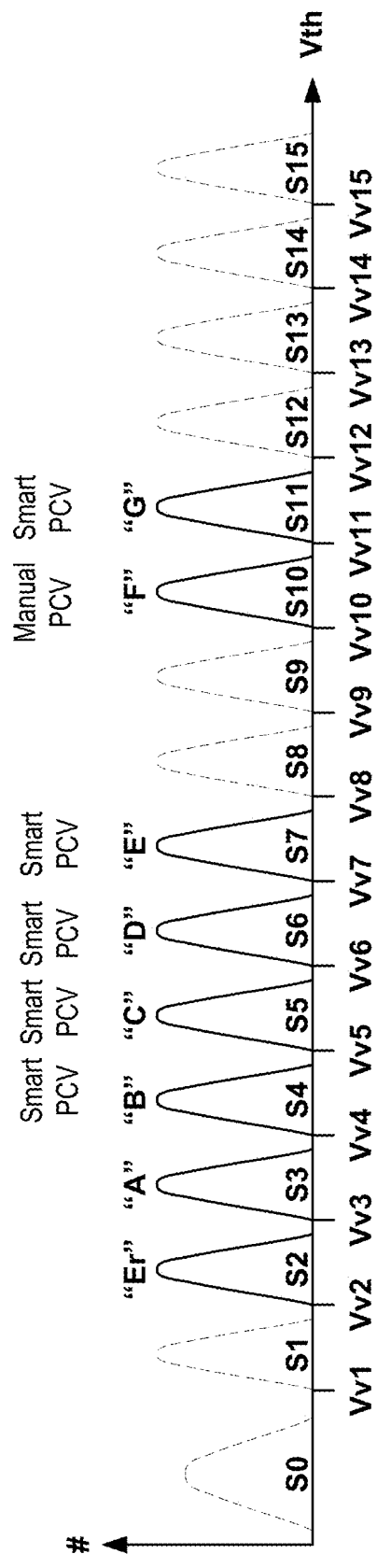
FIG. 16B3
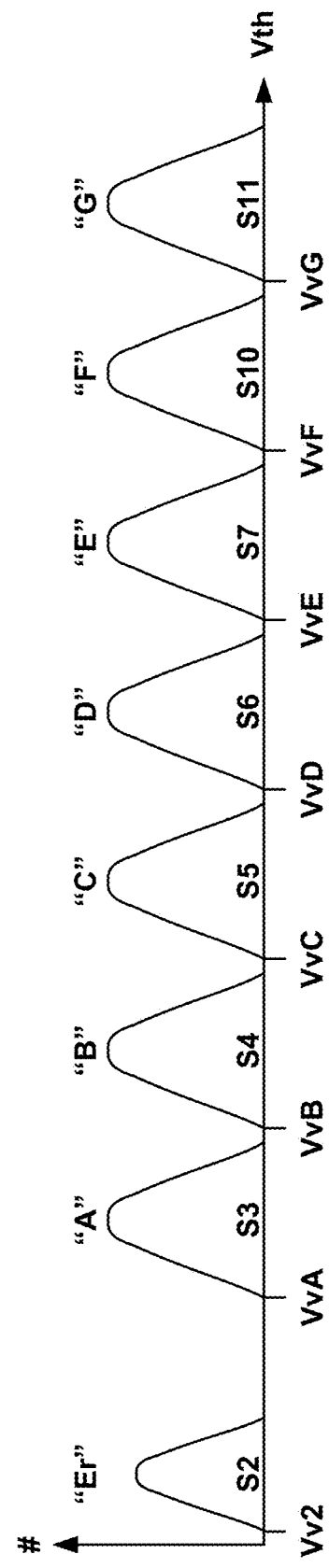
FIG. 16B4

FIG. 16C1 — 1600c1

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 16C2 — 1600c2

| | "Er" | "A" | "B" | "C" | "D" | "E" | "F" | "G" |
|---|---|---|---|---|---|---|---|---|
| | S0 | S3 | S4 | S5 | S6 | S13 | S14 | S15 |
| TP | 1 | 1 | 1 | 1 | 1 | 1 | 1 | 1 |
| UP | 1 | 0 | 0 | 0 | 0 | 1 | 1 | 1 |
| MP | 1 | 1 | 0 | 0 | 1 | 0 | 0 | 1 |
| LP | 1 | 1 | 1 | 0 | 0 | 1 | 0 | 0 |

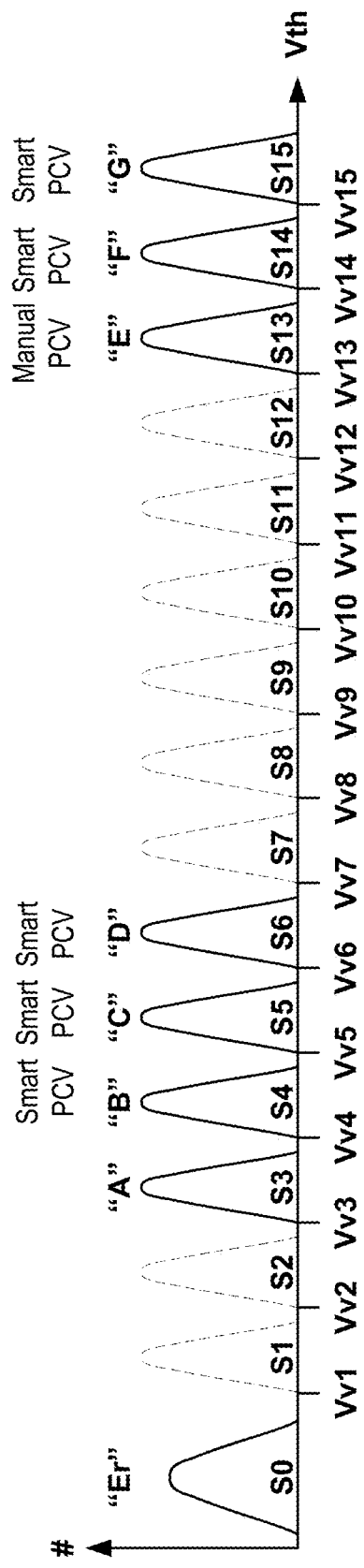
FIG. 16C3
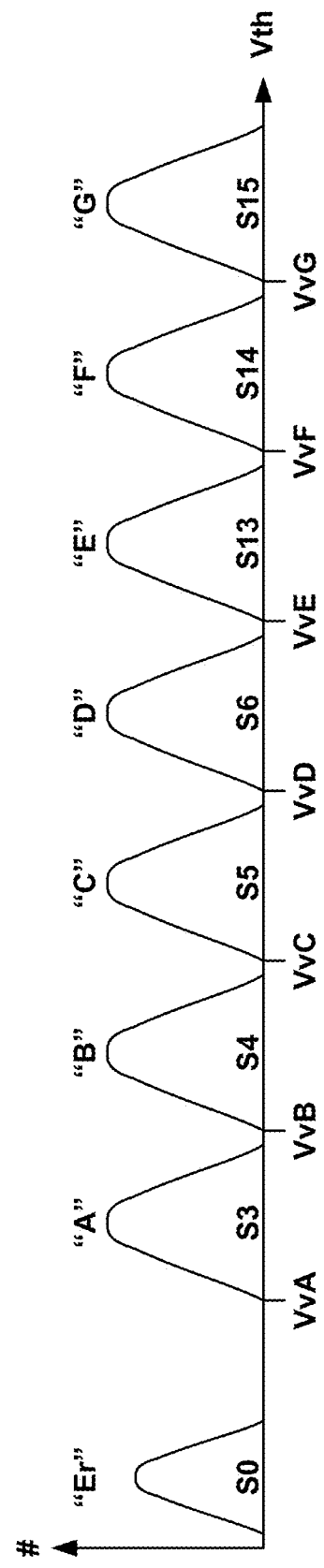
FIG. 16C4

1600d1
| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 1 | 0 | 1 | 1 | 1 | 0 | 0 |
FIG. 16D1
1600d2
| | "Er" | "A" | "B" | "C" | "D" | "E" | "F" | "G" |
|---|---|---|---|---|---|---|---|---|
| | S1 | S2 | S7 | S8 | S9 | S10 | S11 | S12 |
| TP | 0 | 0 | 0 | 0 | 0 | 0 | 0 | 0 |
| UP | 1 | 0 | 0 | 1 | 1 | 0 | 0 | 1 |
| MP | 1 | 1 | 1 | 1 | 0 | 0 | 0 | 0 |
| LP | 1 | 1 | 0 | 0 | 0 | 0 | 1 | 1 |
FIG. 16D2

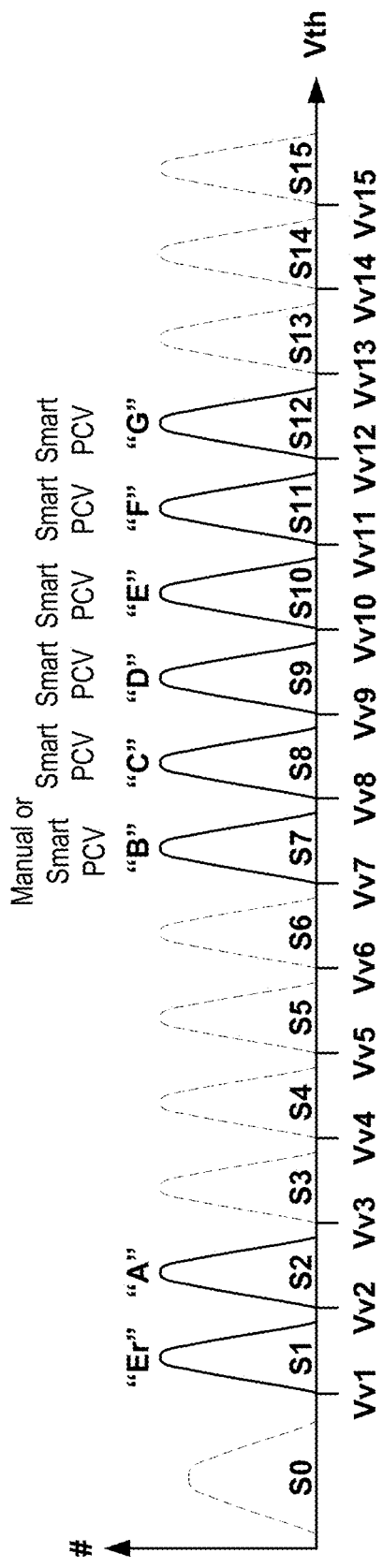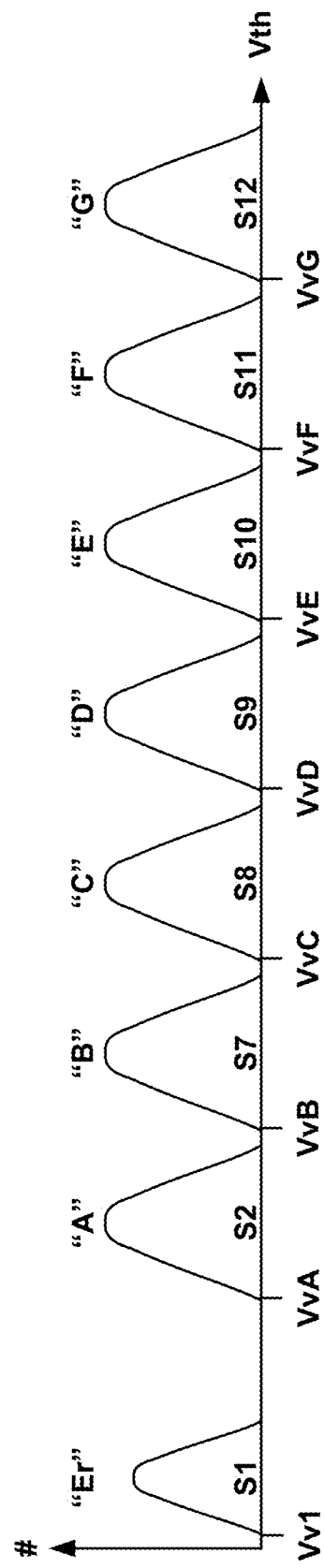
FIG. 16D3
FIG. 16D4

1600e1

| | S̄0 | S̄1 | S̄2 | S̄3 | S4 | S5 | S̄6 | S̄7 | S̄8 | S9 | S10 | S11 | S12 | S13 | S14 | S̄15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 1 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

| "Er" | "A" | "B" | "C" | "D" | "E" | "F" | "G" |
|---|---|---|---|---|---|---|---|
| S0 | S1 | S2 | S3 | S6 | S7 | S8 | S15 |
| 1 | 0 | 0 | 1 | 1 | 0 | 0 | 1 |
| 1 | 1 | 0 | 0 | 0 | 0 | 1 | 1 |
| 1 | 1 | 1 | 1 | 1 | 1 | 1 | 1 |
| 1 | 1 | 1 | 1 | 0 | 0 | 0 | 0 |

| TP |
| UP |
| MP |
| LP |

FIG. 16E2

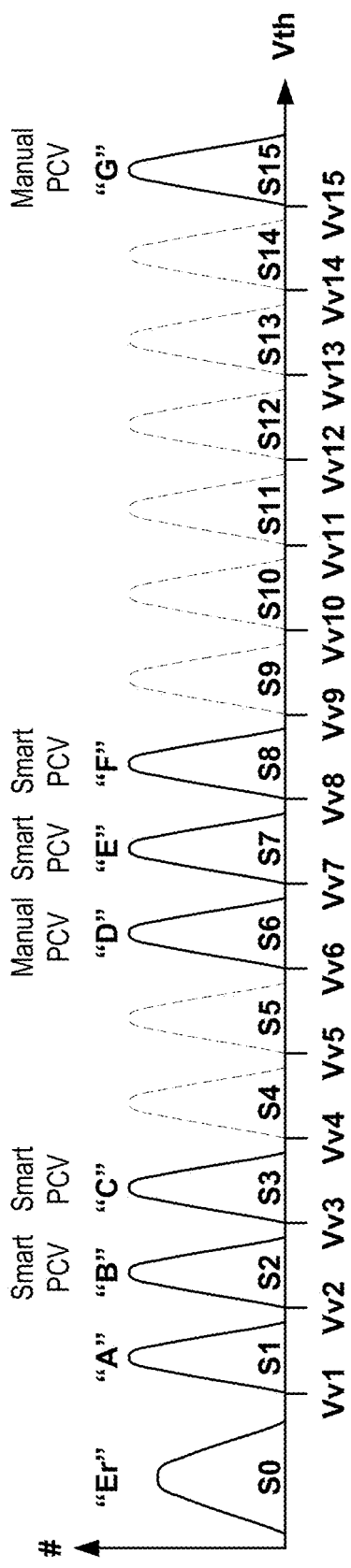
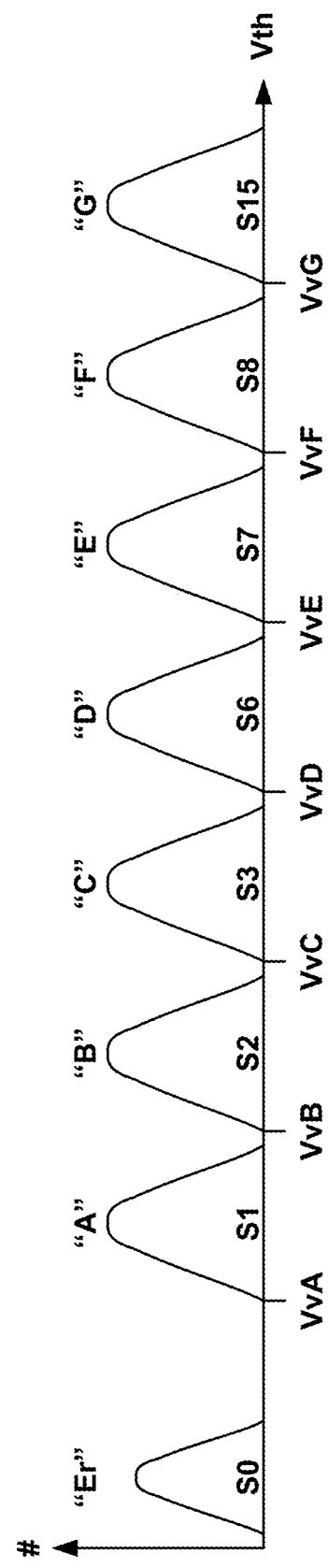
FIG. 16E3
FIG. 16E4

FIG. 16F1 — 1600f1

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 16F2 — 1600f2

| | "Er" S4 | "A" S5 | "B" S9 | "C" S10 | "D" S11 | "E" S12 | "F" S13 | "G" S14 |
|---|---|---|---|---|---|---|---|---|
| TP | 1 | 1 | 0 | 0 | 0 | 0 | 1 | 1 |
| UP | 0 | 0 | 1 | 0 | 0 | 1 | 1 | 1 |
| MP | 0 | 0 | 0 | 0 | 0 | 0 | 0 | 0 |
| LP | 1 | 0 | 0 | 0 | 1 | 1 | 1 | 0 |

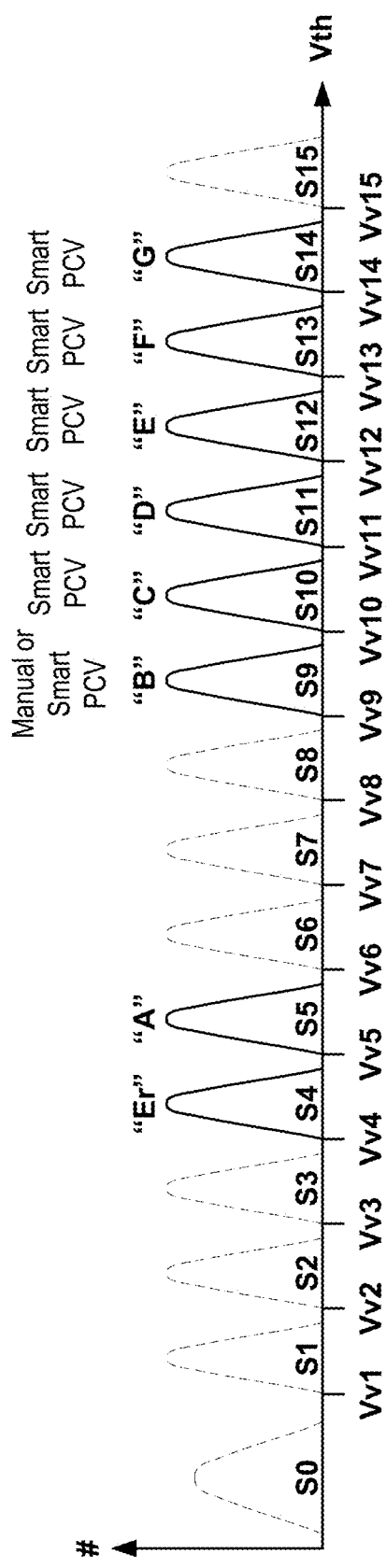
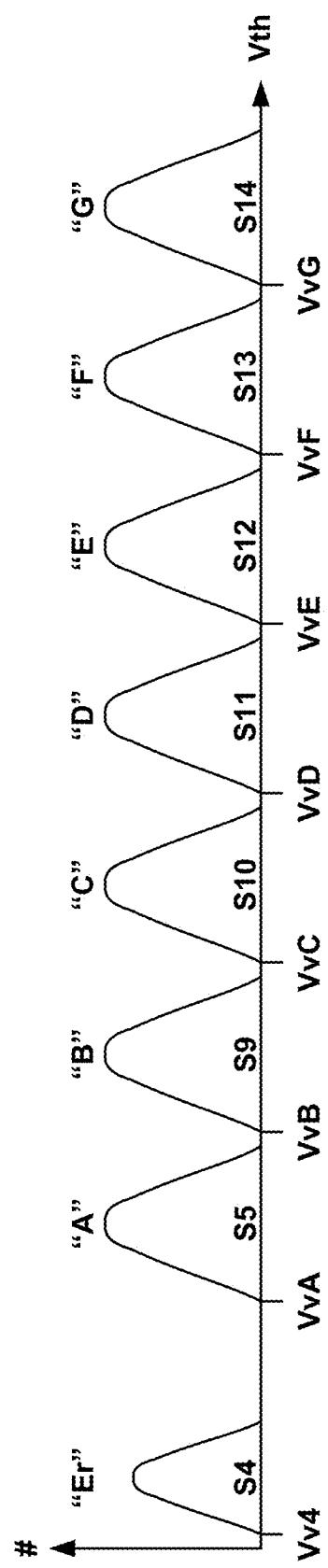
FIG. 16F3
FIG. 16F4

FIG. 16G1 — 1600g1

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | (S̄0) | (S̄1) | (S̄2) | (S̄3) | (S̄4) | S5 | S6 | S7 | S8 | S9 | S10 | (S̄11) | (S̄12) | (S̄13) | S14 | S15 |
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 0 | 0 | 0 | 0 | 0 | 0 | 0 | 1 |
| LP | (1) | (1) | (1) | (1) | (1) | 0 | 0 | 0 | 0 | 0 | 0 | (1) | (1) | (1) | 0 | 0 |

FIG. 16G2 — 1600g2

| | "Er" S0 | "A" S1 | "B" S2 | "C" S3 | "D" S4 | "E" S11 | "F" S12 | "G" S13 |
|---|---|---|---|---|---|---|---|---|
| TP | 1 | 0 | 0 | 1 | 1 | 0 | 0 | 1 |
| UP | 1 | 1 | 0 | 0 | 0 | 0 | 1 | 1 |
| MP | 1 | 1 | 1 | 1 | 0 | 0 | 0 | 0 |
| LP | 1 | 1 | 1 | 1 | 1 | 1 | 1 | 1 |

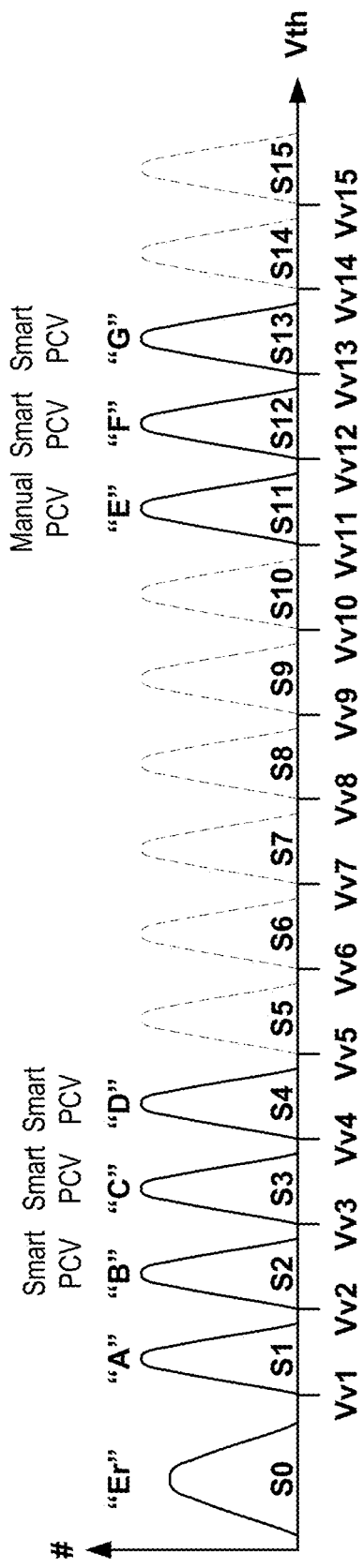
FIG. 16G3
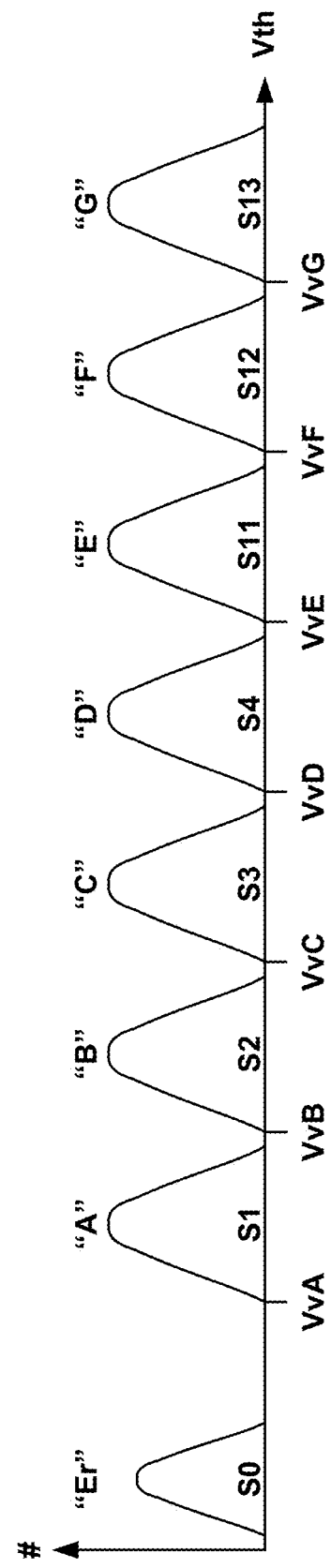
FIG. 16G4

1600h1

| | S0 | S1 | S2 | S3 | S4 | (S5) | (S6) | (S7) | (S8) | (S9) | (S10) | S11 | S12 | S13 | (S14) | (S15) |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

| | "Er" | "A" | "B" | "C" | "D" | "E" | "F" | "G" |
|---|---|---|---|---|---|---|---|---|
| | S5 | S6 | S7 | S8 | S9 | S10 | S14 | S15 |
| TP | 1 | 1 | 0 | 0 | 0 | 0 | 1 | 1 |
| UP | 0 | 0 | 0 | 1 | 1 | 0 | 1 | 1 |
| MP | 0 | 1 | 1 | 1 | 0 | 0 | 0 | 1 |
| LP | 0 | 0 | 0 | 0 | 0 | 0 | 0 | 0 |

FIG. 16H2

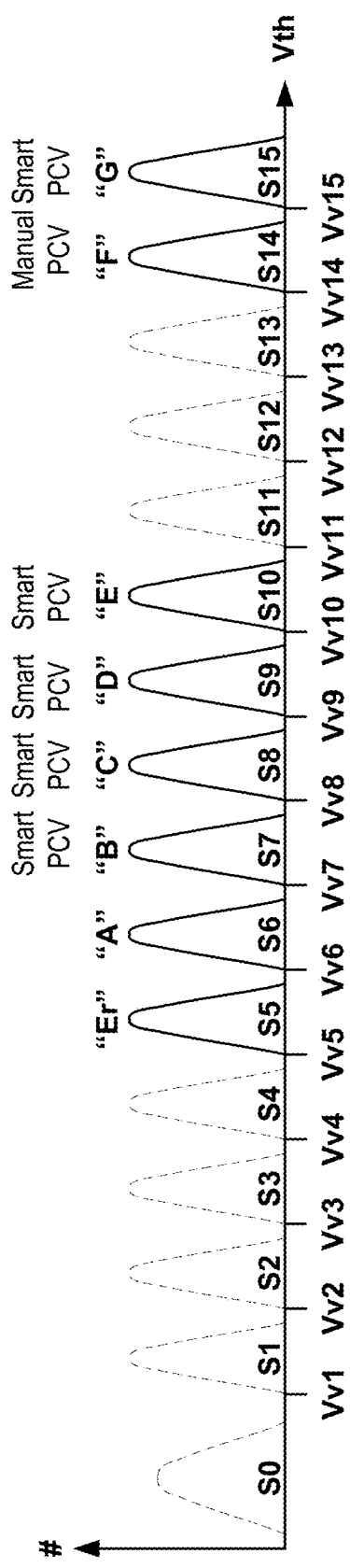
FIG. 16H3
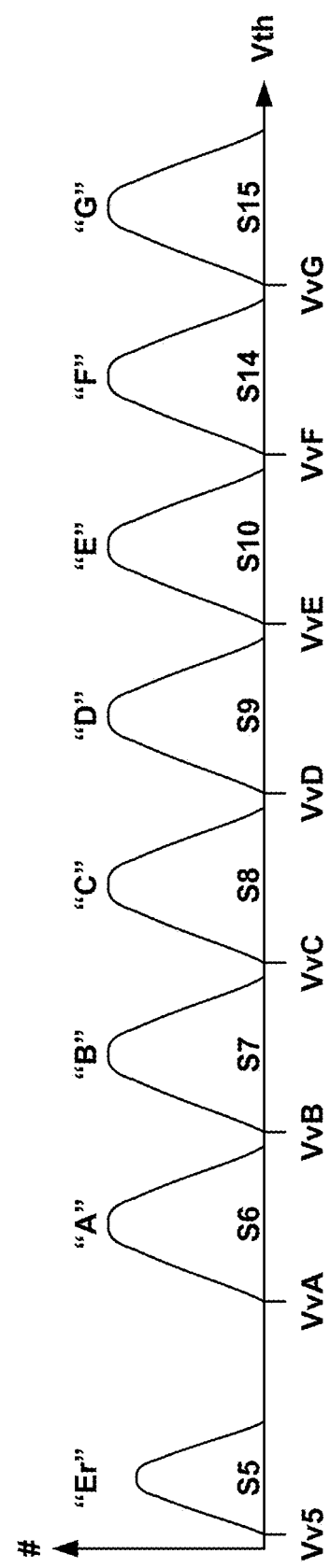
FIG. 16H4

HYBRID SMART VERIFY FOR QLC/TLC DIE

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as physical blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

For memory such as NAND, a large set of memory cells are first erased. Herein, a set of memory cells that are erased as a unit are referred to as an "erase block." In some cases an erase block coincides with a physical block. In some cases an erase block is a portion of a physical block. Then, the memory cells within the erase block are programmed one group at a time. The unit of programming is typically referred to as a physical page of memory cells. The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of programming voltage pulses are applied to the control gates of the memory cells. Each voltage pulse may be stepped up in magnitude from a previous program pulse by a step size in a processed referred to as incremental step pulse programming. A program voltage may be followed by one or more verify operation to determine if memory cells have been programmed to a corresponding one or more target data states. In some techniques, only a subset of the target verify states are verified after a program pulse. Each verify operation takes a finite amount of time; therefore, reducing the total number of verify operations reduces programming time. Reducing the total number of verify operations also saves current and/or power.

However, there are technical challenges in determining which states should be verified after a given program pulse. Over-programming of memory cells of a target state can occur if verify of the target state is skipped after a program pulse. On the other hand, time, current and/or power may be wasted by verifying a target state too early in the programming process.

BRIEF DESCRIPTION OF THE DRAWINGS

Like-numbered elements refer to common components in the different figures.

FIG. 5A depicts an embodiment of threshold voltage Vth distributions for a four-state memory device in which each memory cell stores two bits of data.

FIG. 5B depicts an embodiment of threshold voltage Vth distributions for an eight-state memory device in which each memory cell stores three bits of data.

FIG. 5C depicts an embodiment of threshold voltage Vth distributions for a sixteen state memory device in which each memory cell stores four bits of data.

FIG. 7A1 is a table of an example gray code used to represent sixteen data states.

FIG. 7A2 is a table of an example gray code used top represent eight data states which may be generated from the example gray code of FIG. 7A1.

FIG. 7A3 depicts an embodiment of threshold voltage distributions for an eight-state memory device in which each memory cell stores three bits of data, programmed using the example gray code of FIG. 7A2.

FIG. 7A4 depicts an embodiment of threshold voltage distributions for an eight-state memory device in which each memory cell stores three bits of data, programmed using the example gray code of FIG. 7A2 with tuned verify levels.

FIG. 8 is a flowchart of one embodiment of a process of state dependent smart verify in a memory system that uses both an X3 mode and an X4 mode.

FIG. 16B1 is a table of an example gray code used to represent sixteen data states.

FIG. 16B2 is a table of an example gray code used top represent eight data states which may be generated from the example gray code of FIG. 16B1.

FIG. 16B3 depicts an embodiment of threshold voltage distributions for an eight-state memory device in which each memory cell stores three bits of data, programmed using the example gray code of FIG. 16B2.

FIG. 16B4 depicts an embodiment of threshold voltage distributions for an eight-state memory device in which each memory cell stores three bits of data, programmed using the example gray code of FIG. 16B2 with tuned verify levels.

FIG. 16C1 is a table of an example gray code used to represent sixteen data states.

FIG. 16C2 is a table of an example gray code used top represent eight data states which may be generated from the example gray code of FIG. 16C1.

FIG. 16C3 depicts an embodiment of threshold voltage distributions for an eight-state memory device in which each memory cell stores three bits of data, programmed using the example gray code of FIG. 16C2.

FIG. 16C4 depicts an embodiment of threshold voltage distributions for an eight-state memory device in which each memory cell stores three bits of data, programmed using the example gray code of FIG. 16C2 with tuned verify levels.

FIG. 16D1 is a table of an example gray code used to represent sixteen data states.

FIG. 16D2 is a table of an example gray code used top represent eight data states which may be generated from the example gray code of FIG. 16D1.

FIG. 16D3 depicts an embodiment of threshold voltage distributions for an eight-state memory device in which each memory cell stores three bits of data, programmed using the example gray code of FIG. 16D2.

FIG. 16D4 depicts an embodiment of threshold voltage distributions for an eight-state memory device in which each memory cell stores three bits of data, programmed using the example gray code of FIG. 16D2 with tuned verify levels.

FIG. 16E1 is a table of an example gray code used to represent sixteen data states.

FIG. 16E2 is a table of an example gray code used top represent eight data states which may be generated from the example gray code of FIG. 16E1.

FIG. 16E3 depicts an embodiment of threshold voltage distributions for an eight-state memory device in which each memory cell stores three bits of data, programmed using the example gray code of FIG. 16E2.

FIG. 16E4 depicts an embodiment of threshold voltage distributions for an eight-state memory device in which each memory cell stores three bits of data, programmed using the example gray code of FIG. 16E2 with tuned verify levels.

FIG. 16F1 is a table of an example gray code used to represent sixteen data states.

FIG. 16F2 is a table of an example gray code used top represent eight data states which may be generated from the example gray code of FIG. 16F1.

FIG. 16F3 depicts an embodiment of threshold voltage distributions for an eight-state memory device in which each memory cell stores three bits of data, programmed using the example gray code of FIG. 16F2.

FIG. 16F4 depicts an embodiment of threshold voltage distributions for an eight-state memory device in which each memory cell stores three bits of data, programmed using the example gray code of FIG. 16F2 with tuned verify levels.

FIG. 16G1 is a table of an example gray code used to represent sixteen data states.

FIG. 16G2 is a table of an example gray code used top represent eight data states which may be generated from the example gray code of FIG. 16G1.

FIG. 16G3 depicts an embodiment of threshold voltage distributions for an eight-state memory device in which each memory cell stores three bits of data, programmed using the example gray code of FIG. 16G2.

FIG. 16G4 depicts an embodiment of threshold voltage distributions for an eight-state memory device in which each memory cell stores three bits of data, programmed using the example gray code of FIG. 16G2 with tuned verify levels.

FIG. 16H1 is a table of an example gray code used to represent sixteen data states.

FIG. 16H2 is a table of an example gray code used top represent eight data states which may be generated from the example gray code of FIG. 16H1.

FIG. 16H3 depicts an embodiment of threshold voltage distributions for an eight-state memory device in which each memory cell stores three bits of data, programmed using the example gray code of FIG. 16H2.

FIG. 16H4 depicts an embodiment of threshold voltage distributions for an eight-state memory device in which each memory cell stores three bits of data, programmed using the example gray code of FIG. 16H2 with tuned verify levels.

DETAILED DESCRIPTION

Figure 1:
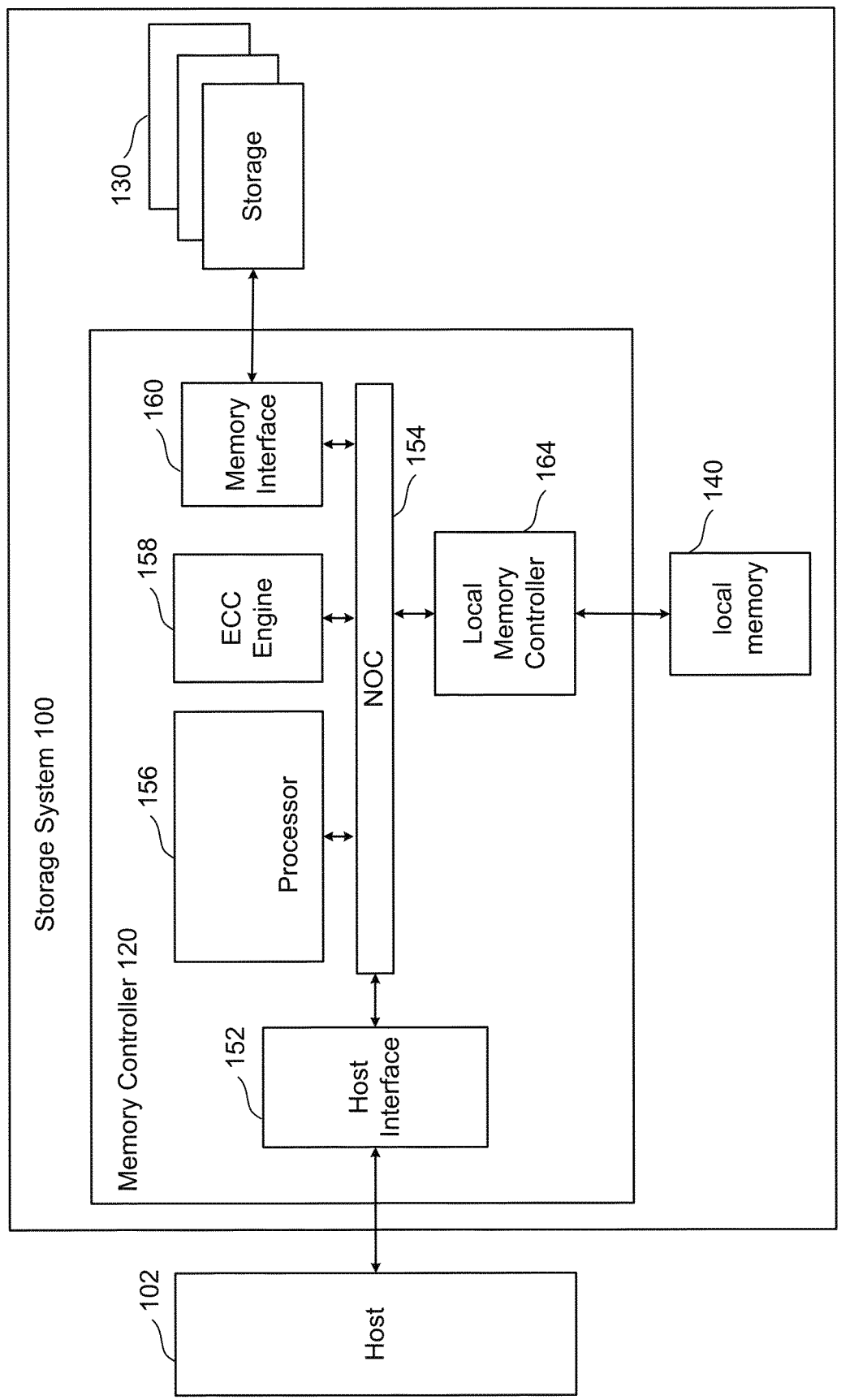
FIG. 1 is a block diagram depicting one embodiment of a storage system.

Technology is disclosed herein for smart verify in a memory system that is capable of programming data in different multi-bit per cell modes. In an embodiment, the memory system programs memory cells in the memory structure in four bit per cell mode (or X4 mode) and also a three bit per cell mode (or X3 mode). The four bit per cell mode uses a four-bit gray code that has four pages and sixteen data states. The three bit per cell mode uses a three-bit gray code that is based on the four-bit gray code. The three-bit gray code is based on three of the four pages of the four-bit gray code. By basing the three-bit code on three of the four pages of the four-bit gray code, a considerable portion of the logic that is used for programming to four bits per cell can also be used for programming in to three bits per cell. However, since the three-bit gray code only uses eight of the sixteen states from the four-bit gray code, technical challenges arise for verification using the three-bit gray code. In particular, the logic that determines which states to skip verify in an X4 programming mode may be unsuitable to use for skipping verify in an X3 programming mode. Techniques are disclosed herein for skipping verify of states in the X3 programming mode, while still allowing a considerable portion of the programming logic from the X4 programming mode to be used in the X3 programming mode.

In one embodiment, in an X3 programming mode the memory system counts the number of memory cells having a threshold voltage above a verify voltage for an A-state (of A- to G-states in an X3 mode) after each program pulse. Verification of the B-state is skipped on the next program-verify (PV) loop responsive to the number of memory cells having a threshold voltage above the verify voltage for the A-state being below a threshold for a PV loop. Verification the B-state begins on the next PV loop after the first time the number of memory cells having a threshold voltage above the verify voltage for the A-state are above the threshold. By waiting to verify the B-state until a sufficient number of cells have a Vt above the A-state verify voltage, the memory system avoids verifying the B-state too soon. Therefore, time, power and/or current is saved. Also, the memory system avoids verifying the B-state too late. Therefore, overprogramming of B-state cells is avoided. Verification may start for the remaining states based on different factors in various embodiments. In one embodiment, verification of each other state begins a pre-determined number of PV loops after verification of the preceding state was begun.

In one embodiment, the memory system determines whether to skip verify for a first set of one or more data states of the X3 programming mode based on a first test and determines whether to skip verify for a second set of one or more data states of the X3 programming mode based on a second test. In one embodiment, the first set includes data states that follow an unused state in the four-bit code, but does not include any data states that follow a used state in the four-bit code. In one embodiment, the second set includes all data states that follow a used state in the four-bit code.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
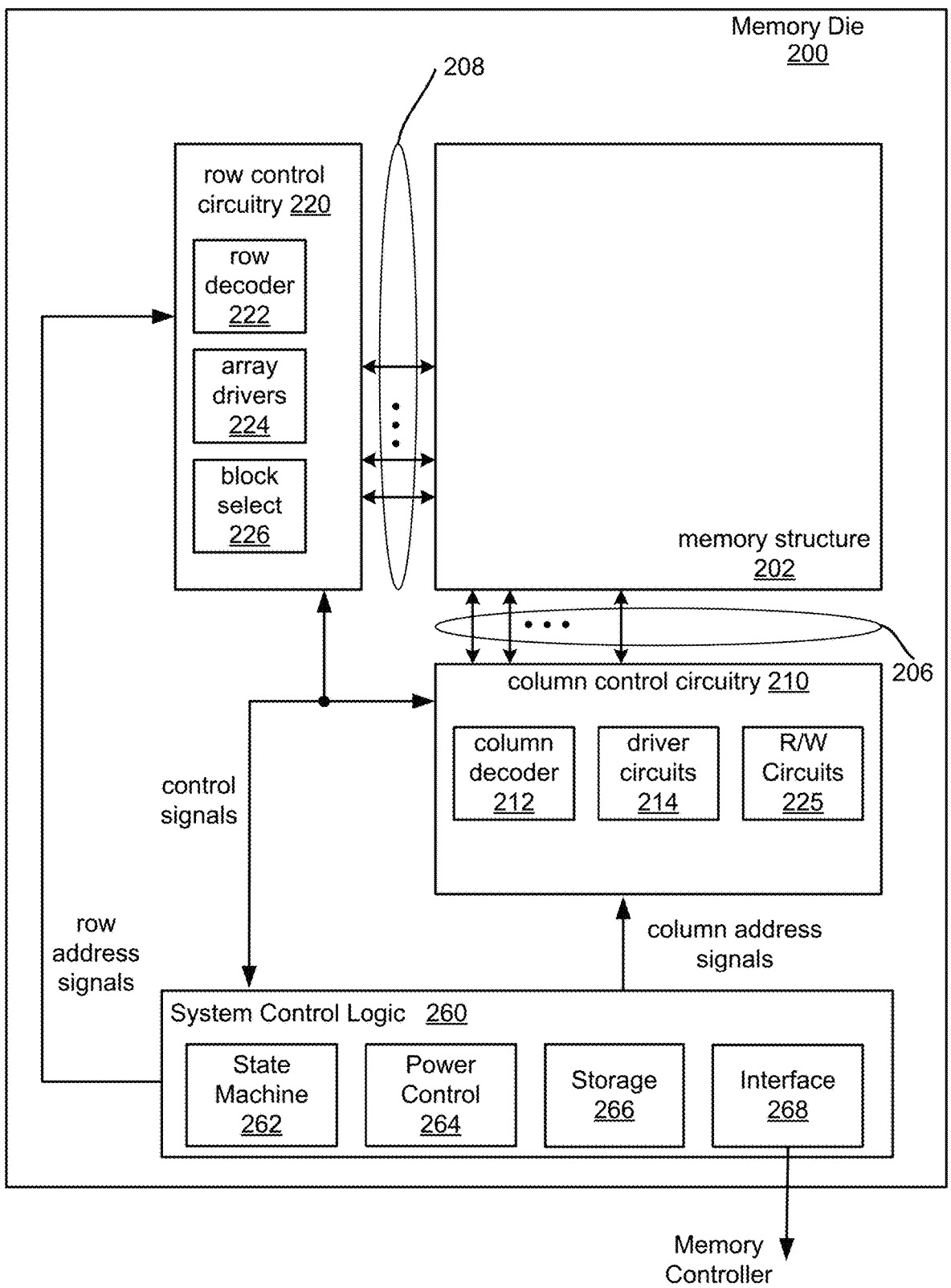
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
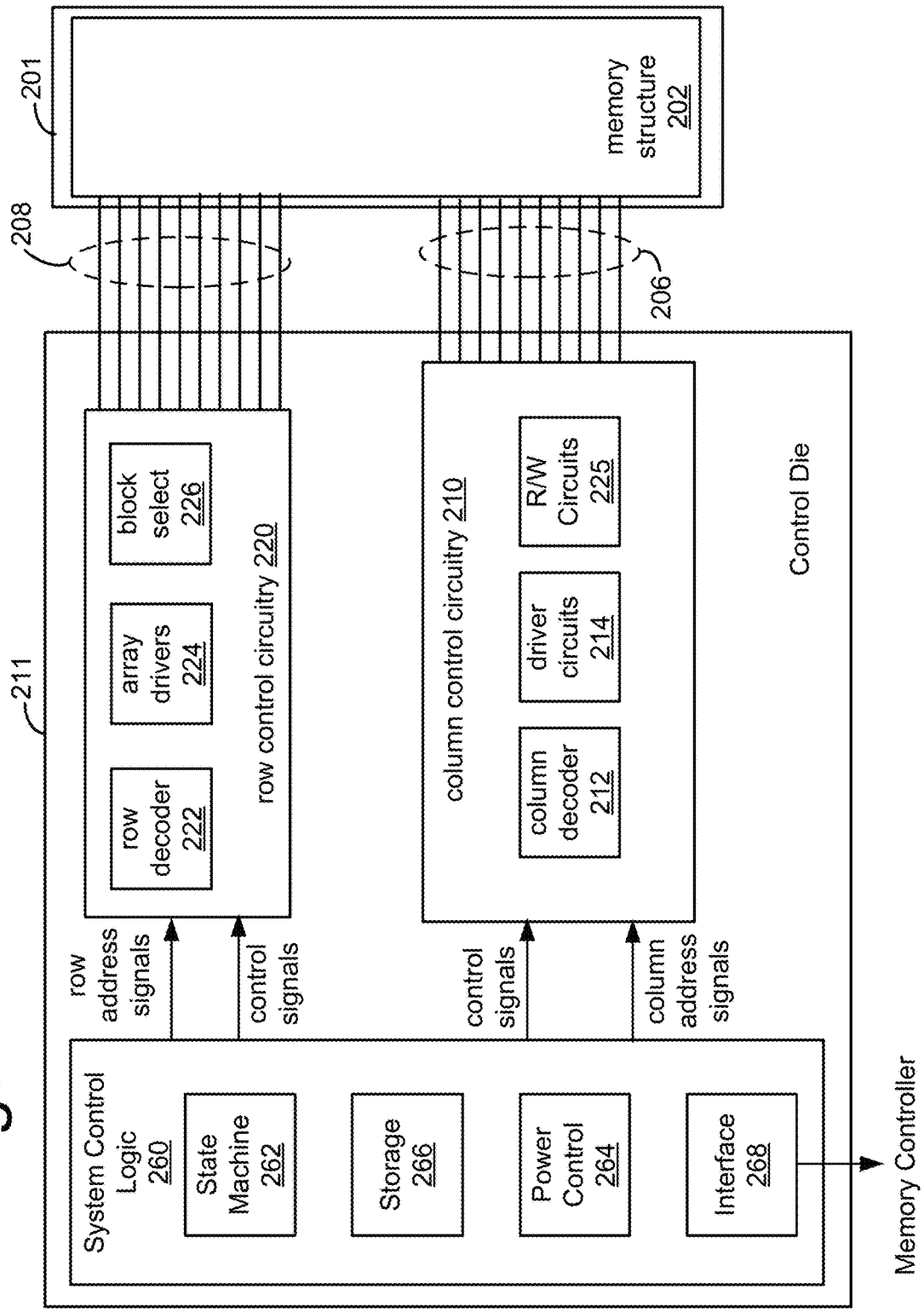
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
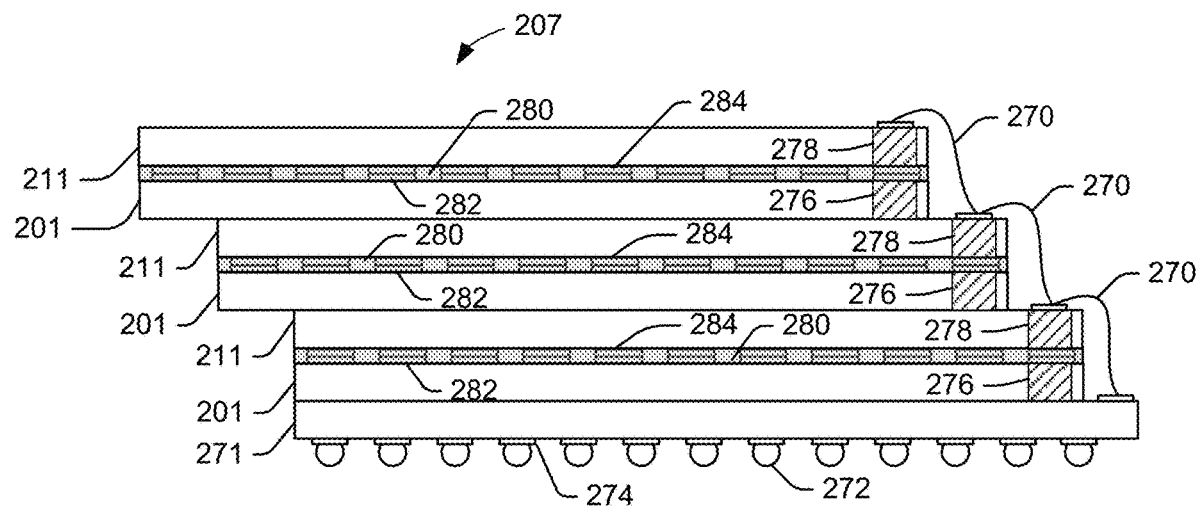
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
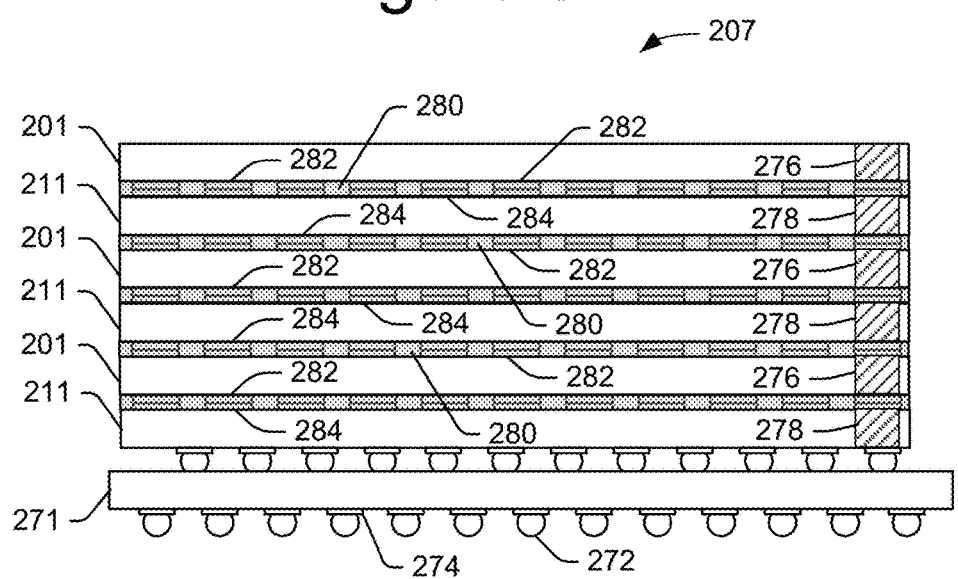

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
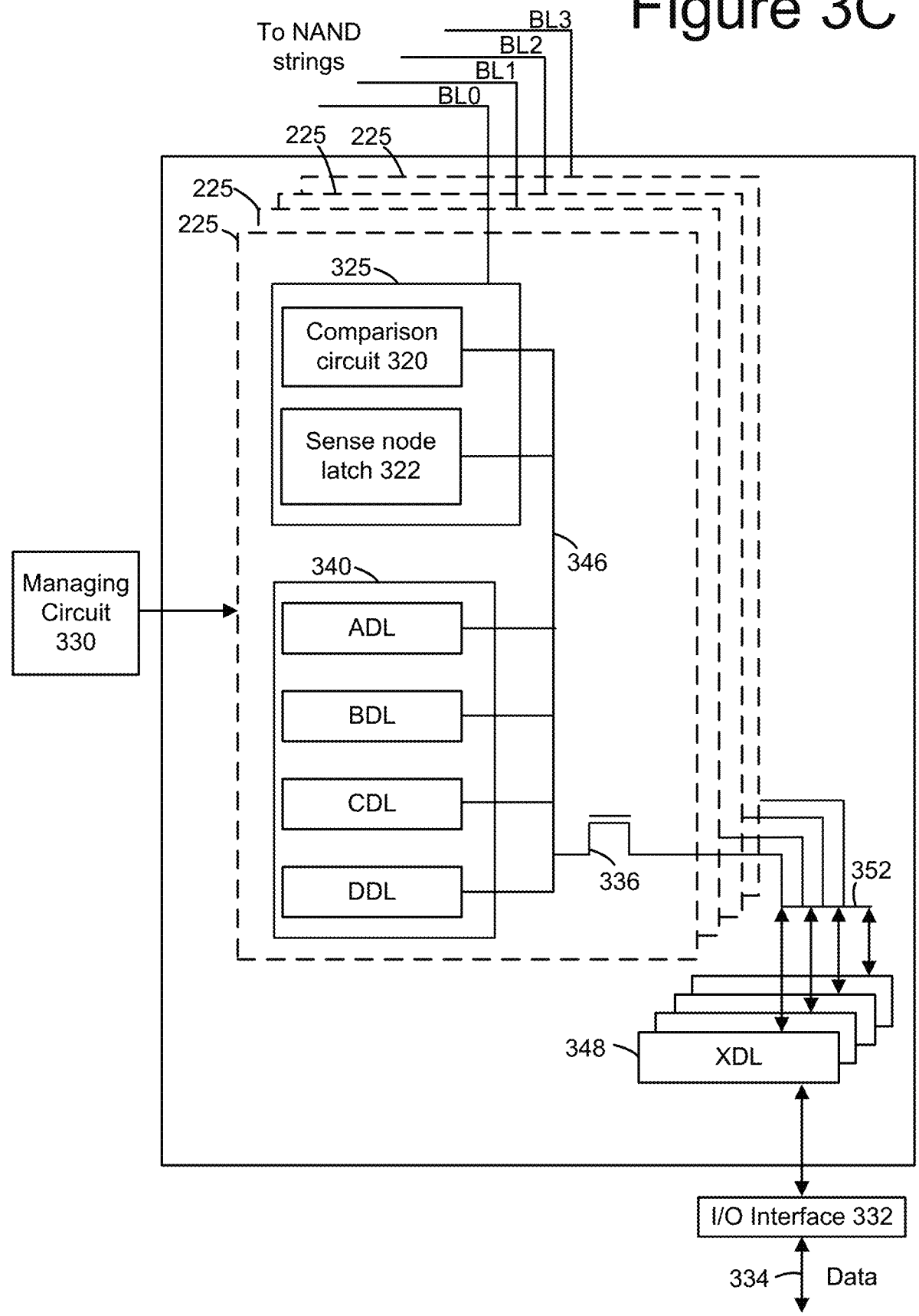
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include four latches (ADL, BDL, CDL, DDL) for each sense amplifier 325 in this example. More or fewer than four latches may be included in the data latches 340. In one embodiment, for programming each data latch 340 is used to store one bit to be stored into a memory cell and for reading each data latch 340 is used to store one bit read from a memory cell. In a four bit per memory cell embodiment, ADL stores a bit for a lower page of data, BDL stores a bit for a middle page of data, CDL stores a bit for an upper page of data, and DDL store a bit for a top page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller. In one embodiment, latch space is saved by not including the DDL latches, but instead using the XDL latches 348 for the top page of data for at least a portion of the program operation. However, using the XDL latches 348 for the top page may slow programming.

In one embodiment, the memory cells are programmed to three bits per cell using at least some of the programming algorithm for programming memory cells to four bits per cell. In one embodiment, the three bit per cell mode has a similar coding scheme to the four bit per cell mode by using three pages of the four pages from the four bit per cell mode. In one embodiment, one of the latches 340 will be set to a default value in the three bit per cell mode, based on which page of the four page code is not used. For example, the three bit mode may use the coding from the lower page, middle page, and top page of the four page code (thereby not using the upper page). In this example, a first page of user data may be stored in the ADL latches, a second page of user data may be stored in the BDL latches, and the third page of user data may be stored in the DDL latches. However, the CDL latches may be set to a default value (e.g., all ones or all zeroes). This technique simplifies the logical circuitry by allowing some of the four page code programming circuitry to be used for programming in the three page code. Techniques are disclosed herein for verifying the memory cells in a three page programming mode.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) may be stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to a desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. Note that the verification phase does not need to verify all of the data states following each program pulse. Embodiments are disclosed herein for determining which data states are to be verified following each program pulse in a three page code.

Figure 4:
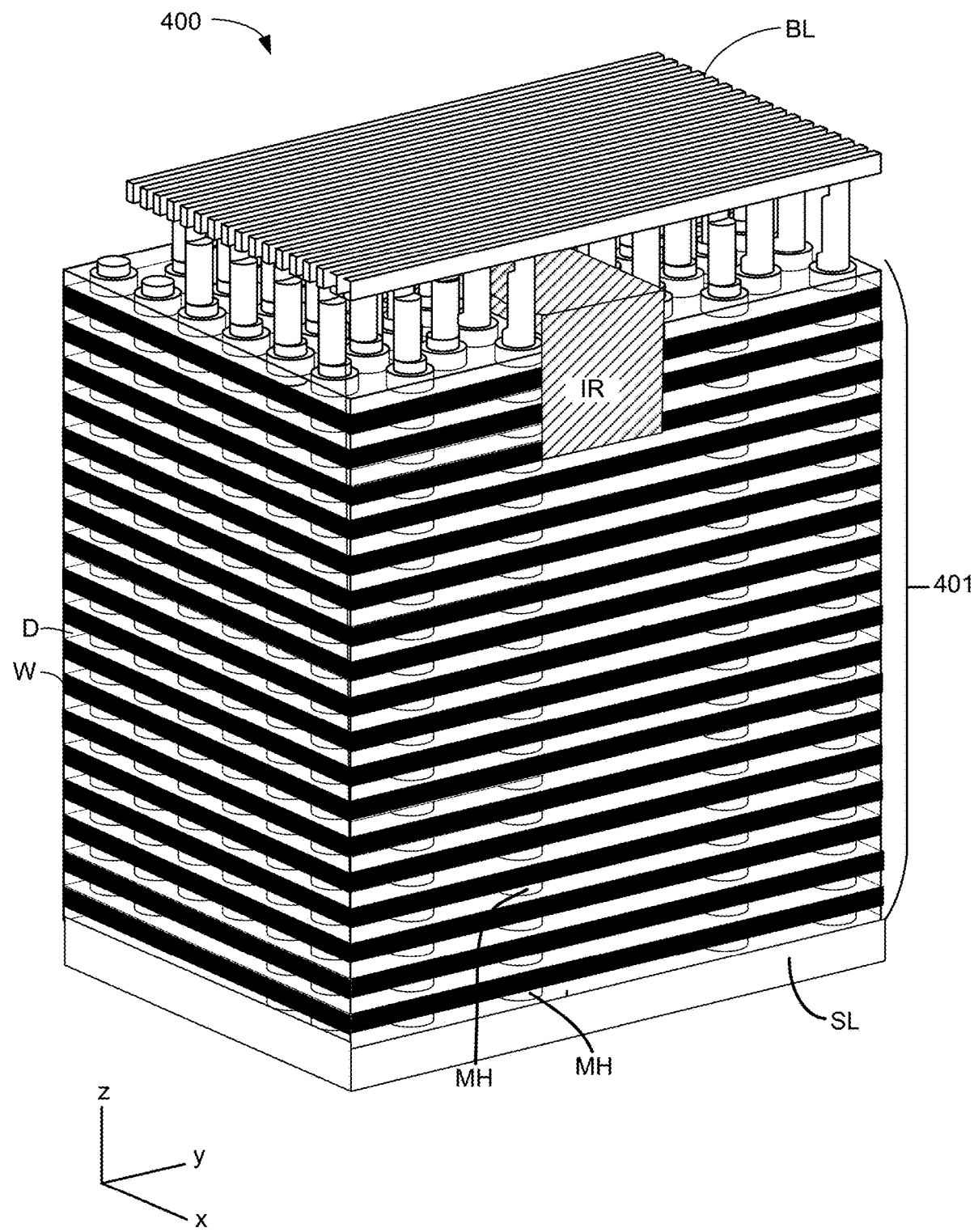
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
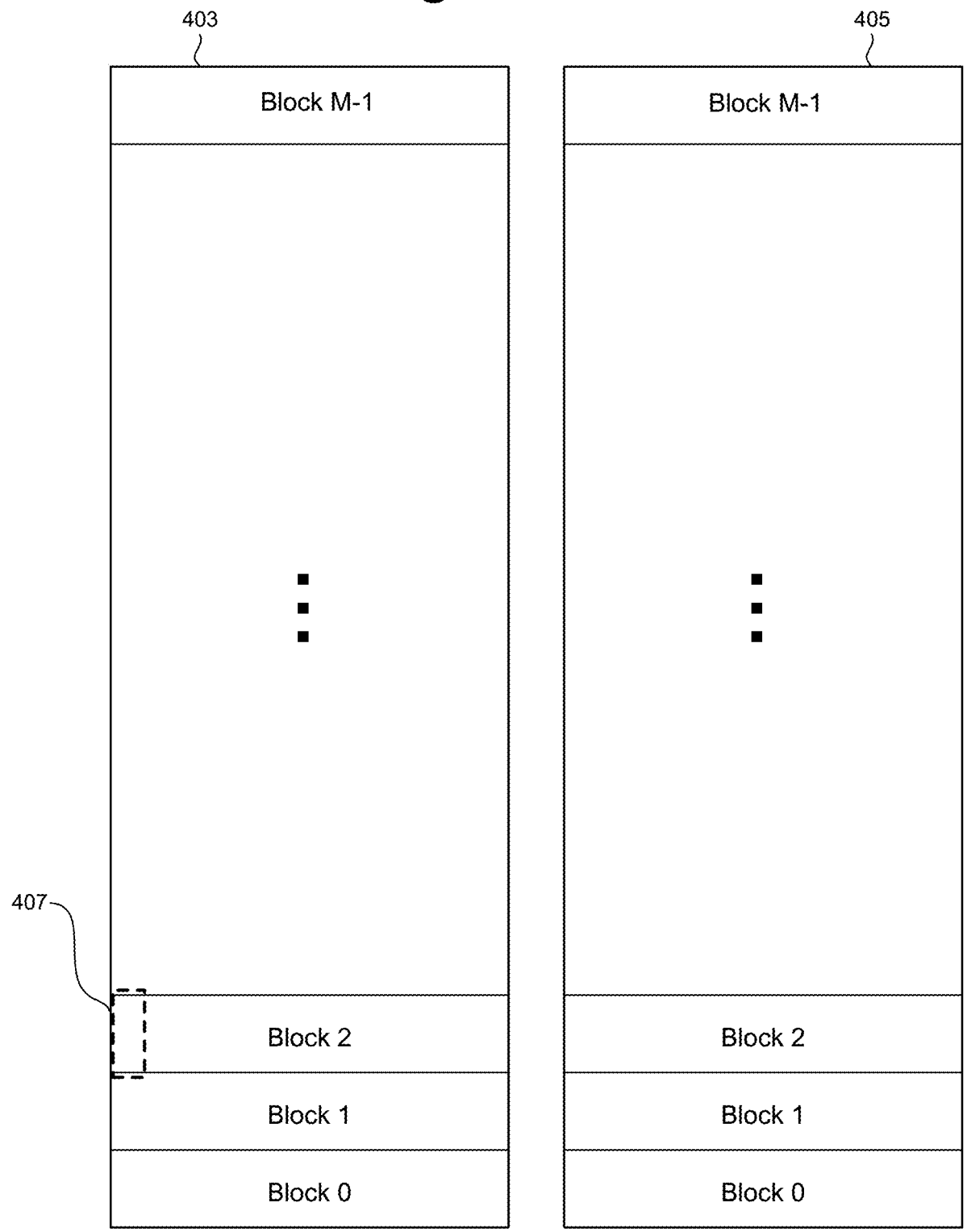
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
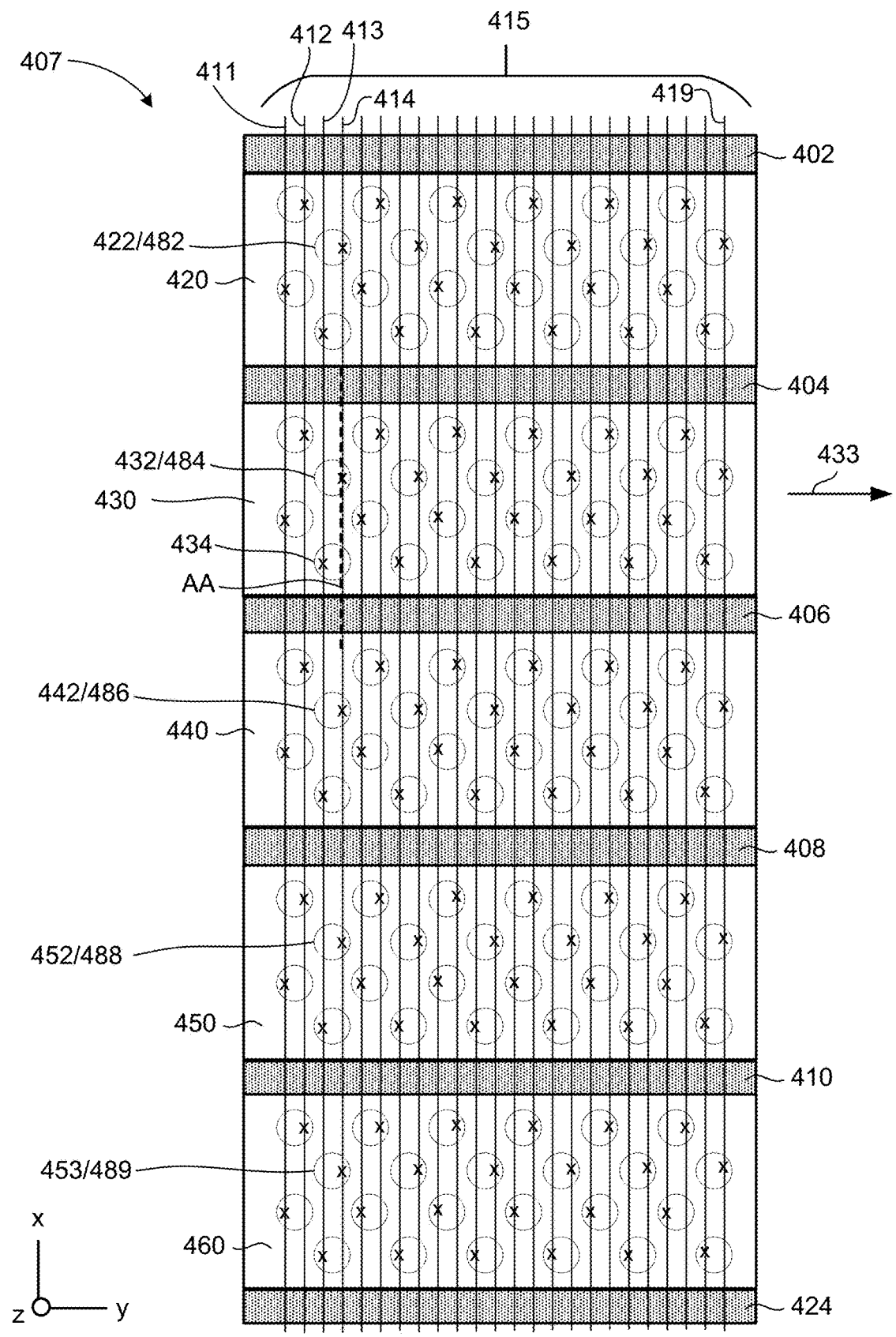
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/

NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
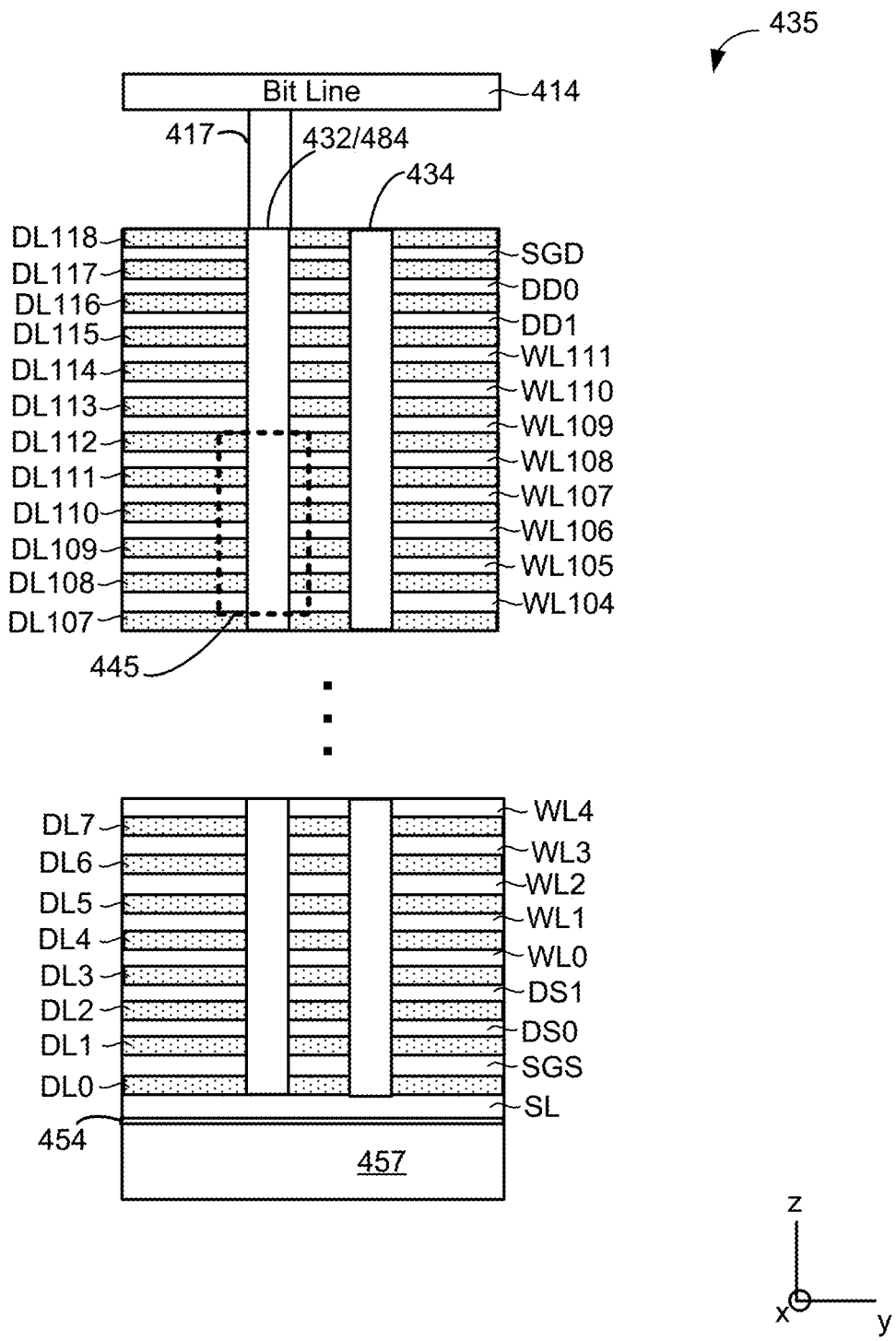
FIG. 4C depicts an embodiment of a stack showing a cross-sectional view along line AA of FIG. 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL111. Each NAND string has a drain side select transistor at the SGD layer. Each NAND string has a source side select transistor at the SGS layer. There may be more than one SGD layer, as well as more than one SGS layer. Also depicted are dielectric layers DL0-DL118.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
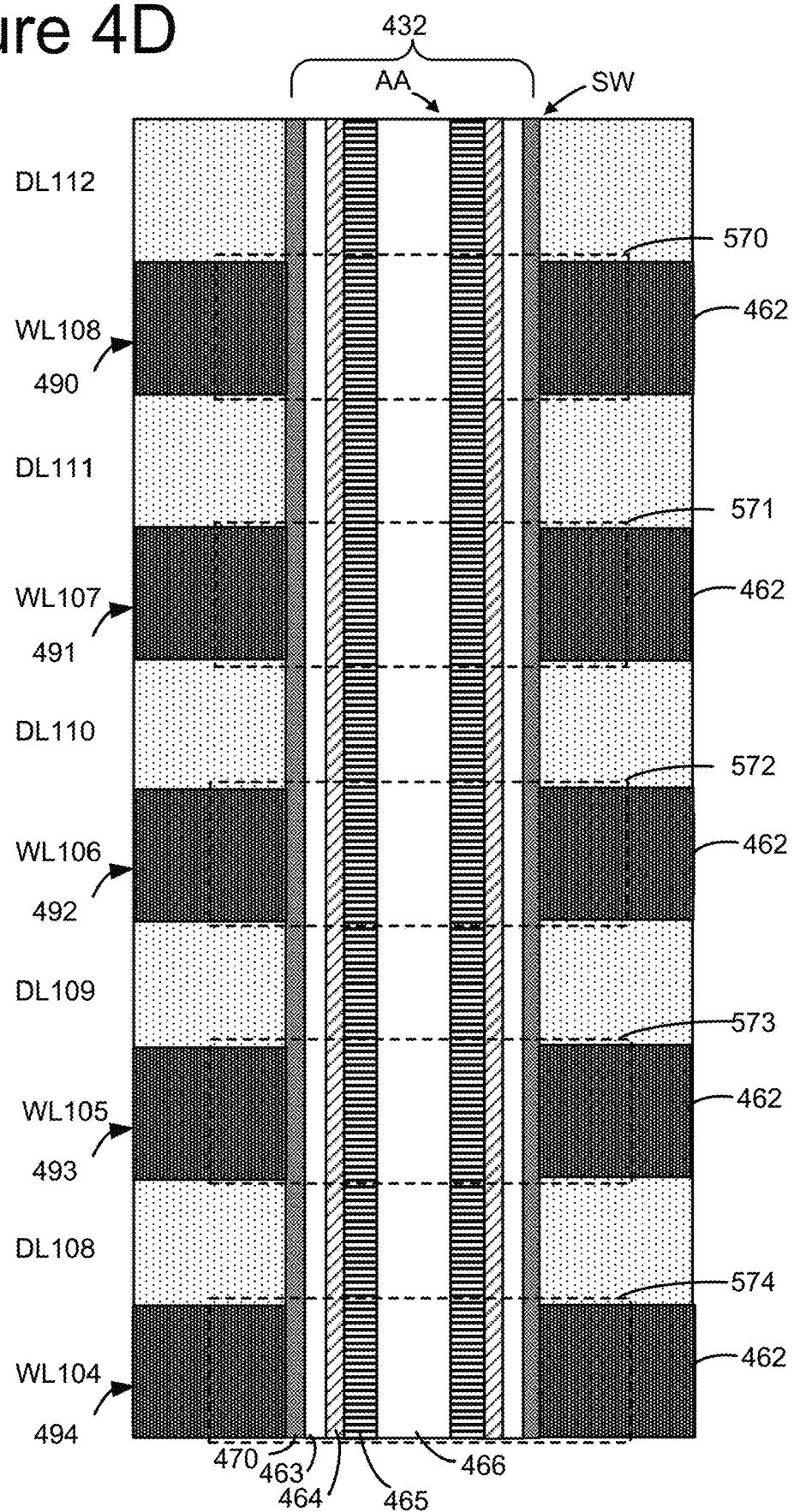
FIG. 4D depicts a view of the region 445 of FIG. 4C.

FIG. 4D depicts a view of the region 445 of FIG. 4C. Data memory cell transistors 570, 571, 572, 573, and 574 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
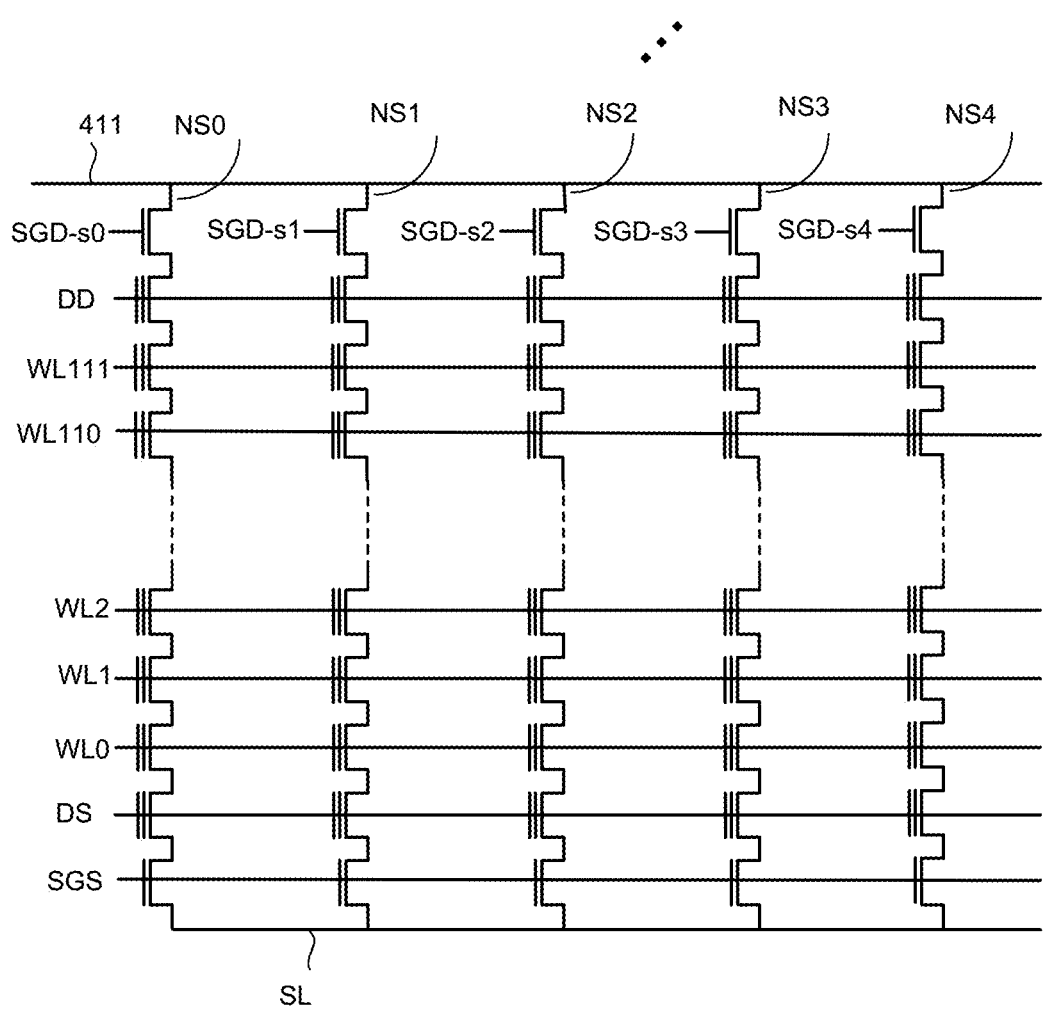
FIG. 4E is a schematic diagram of a portion of one embodiment of a physical block, depicting several NAND strings.

FIG. 4E is a schematic diagram of a portion of the memory structure 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line connected to NAND string NS0, NAND string NS1, NAND string NS2, NAND string NS3, and NAND string NS4.

In one embodiment, there are five drain side select lines in the physical block (SGD-s0, SGD-s1, SGD-s2, SGD-s3, and SGD-s4). Each respective drain side select line can be selected independent of the others. Each drain side select line connects to a group of NAND strings in the block. Only one NAND string of each group is depicted in FIG. 4E. These five drain side select lines correspond to five sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other (2D and 3D) memory structures can also be used with the technology described herein.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

Figure 6:
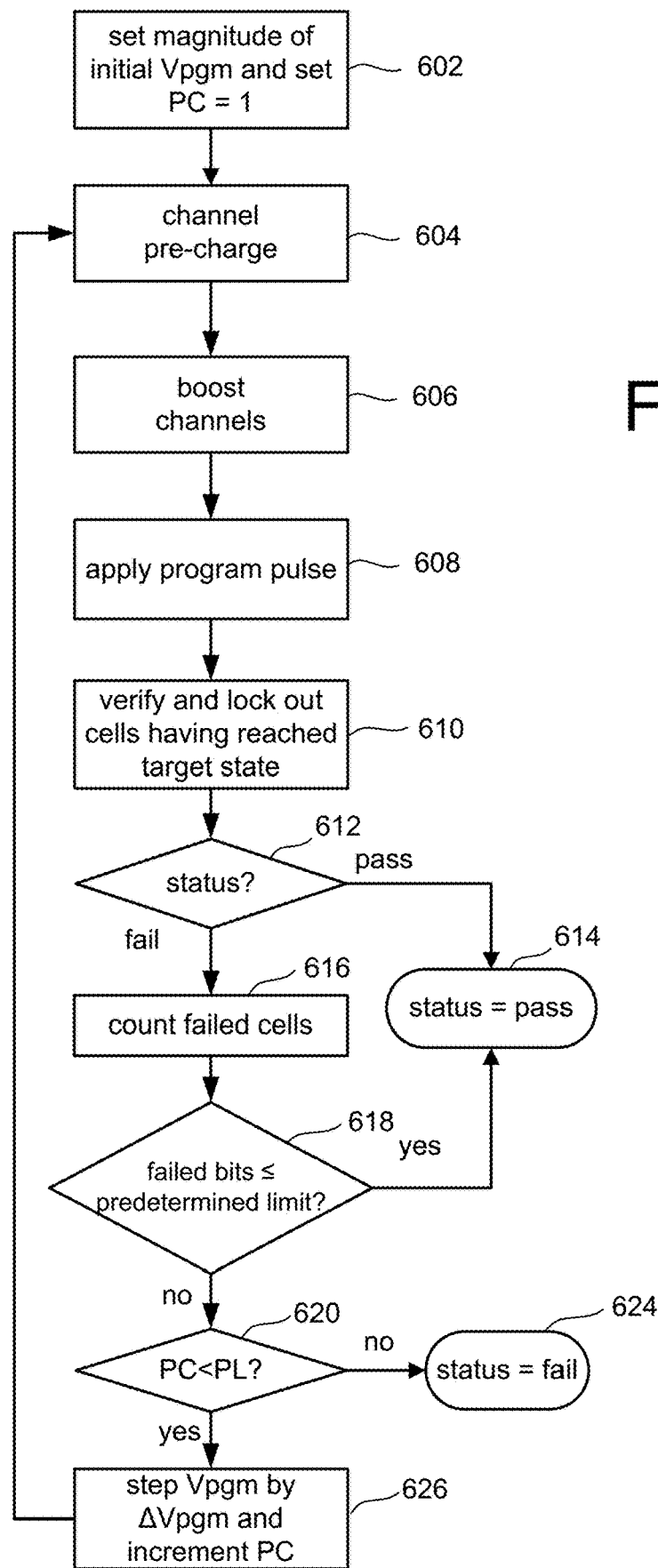
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. Embodiments are disclosed herein for determining which of the data states should be verified in each loop of the programming process. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In one embodiment, the number of memory cells that have a Vt at or above a certain verify reference voltage are counted in step 616. In an embodiment, verification of a data state depends on whether the count of cells above the verify reference voltage exceeds a certain number. For example, verification of the B-state on the next PV loop may depend on whether the count of cells having a Vt above the A-state verify voltage is greater than a certain number. Other examples are discussed in more detail below.

In step 618, it is determined whether the count of failed cells from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Technology is disclosed herein in which memory cells in a memory structure 202 (on memory die 200 or memory structure die 201) may be programmed in a four bit per cell mode (also referred to as QLC, X4 or four page code) or may be programmed in a three bit per cell mode (also referred to as TLC, X3 or three page code). In an embodiment, the system control logic 260 (on either memory die 200 or control die 211) is able to perform an X4 programming algorithm and an X3 programming algorithm. In order to reduce the amount of logic circuitry for programming, at least some of the logic circuitry that is used for X4 programming is also used for X3 programming. In an embodiment, the logic circuits may implement a QLC programming algorithm (gray code and logic) to program 4-bit data in memory cells. In an embodiment, the logic circuits also may implement a TLC programming algorithm (gray code and logic) based on the QLC programming algorithm to program 3-bit data in memory cells. However, technical challenges arise in verifying the memory cells when TLC programming based on the QLC programming algorithm. An embodiment of logical circuits disclosed herein perform a smart verify when TLC programming is based on the QLC programming algorithm.

In an embodiment, an existing QLC gray code is used to generate a TLC gray code. FIG. 7A1 is a table of an example QLC gray code 700a1 used to represent sixteen data states. In particular, QLC gray code 700a1 depicts values for lower page (LP), middle page (MP), upper page (UP) and top page (TP) bits for sixteen data states S0, S1, . . . , S15. For example, for state S3 the LP, MP, UP and TP bits are 1101, respectively, for state S9 the LP, MP, UP and TP bits are 0010, respectively, and so on.

Example QLC gray code 700a1 is sometimes referred to as a "3-4-4-4 code," which refers to the number of read levels for each page, where a read level usually occurs at a transition from 0 to 1 or 1 to 0. So in the example of FIG. 7A1, there are 3 read levels for LP (S4 to S5 transition, S10 to S11 transition, and S13 to S14 transition), 4 read levels for MP (S3 to S4 transition, S5 to S6 transition, S8 to S9 transition and S14 to S15 transition), 4 read levels for UP (S1 to S2 transition, S7 to S8 transition, S9 to S10 transition and S11 to S12 transition), and 4 read levels for TP (S0 to S1 transition, S2 to S3 transition, S6 to S7 transition and S12 to S13 transition). Persons of ordinary skill in the art will understand that QLC gray codes other than the example QLC gray code 700a1 of FIG. 7A1 may be used.

In embodiments, a TLC gray code is generated from a QLC gray code by setting all bits of one of LP, MP, UP and TP to 1 or 0. In an embodiment, a control circuit (e.g., one or more of system control logic 260, read/write circuits 225, row decoder 222 and column decoder 212) sets UP=1. QLC gray code 700a1 shows in dashed line all data states with UP=1. FIG. 7A2 is a table of an example TLC gray code 700a2 which may be generated from the example QLC gray code 700a1 of FIG. 7A1 by setting UP=1. That is, UP=1 for QLC data states S0, S1, S8, S9 and S12-S15. User data is input as three pages of data to LP, MP and TP, as shown in FIG. 7A2.

The example TLC gray code 700a2 is sometimes referred to as a "2-3-2 code," which refers to the number of read levels for each page, where a read level usually occurs at a transition from 0 to 1 or 1 to 0. So in the example of FIG. 7A2, there are 3 read levels for LP (S1 to S8 transition, S9 to S12 transition, and S13 to S14 transition), 2 read levels for MP (S8 to S9 transition and S14 to S15 transition), and 2 read levels for TP (S0 to S1 transition and S12 to S13 transition).

FIG. 7A3 depicts an embodiment of threshold voltage Vth distributions for an X3 programming mode in which each memory cell stores three bits of data, programmed using example TLC gray code 700a2 generated from the example QLC gray code 700a1 of FIG. 7A1 with UP=1. As depicted in the example, states S2-S7 and S10-S11 have no memory cells assigned to those states. Thus, the following 8 states remain: S0, S1, S8, S9, S12, S13, S14 and S15, which are assigned as TLC states "Er," "A,", "B," "C," "D," "E," "F," and "G," respectively.

In an embodiment, one of the data latches (e.g., the UP data latch) is forced to a value of 1, and then the X4 logic on the die (e.g., 200, 211) implements a QLC programming algorithm to program memory cells as TLC memory cells. Instead of 16 data states, 8 data states will result, such as depicted in the example threshold voltage Vth distribution FIG. 7A3 or 7A4.

Although the threshold voltage Vth distribution FIG. 7A3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv1, Vv8, Vv9, Vv12, Vv13, Vv14 and Vv15 of the 7 programmed data states S1, S8, S9, S12, S13, S14 and S15, respectively, so that the threshold voltage Vth distribution is more evenly spaced, such as in the example threshold voltage Vth distribution depicted in FIG. 7A4 (having verify levels VvA, VvB, VvC, VvD, VvE, VvF, and VvG).

In some embodiments, a smart verify is performed for X4 programming. Smart verify can also be referred to as skip verify. In an embodiment of smart verify for X4 programming, the system determines which program loop to start verifying a particular state based on whether the number of memory cells having a Vt above the verify voltage for the immediately preceding state exceed some pre-determined number. For example, for X4 programming verification of the S2 state may be skipped until a pre-determined number of memory cells have a Vt above the Vv1 voltage of the S1 state, verification of the S3 state may be skipped until a pre-determined number of memory cells have a Vt above the Vv2 voltage of the S2 state, etc. This smart verify is effective at reducing the total number of verify operations, thereby saving time, power and/or current. Also, this smart verify is effective at avoiding over-programming memory cells, which could happen if verification of a particular start starts at too high of a program loop.

However, the re-use of at least some of the logic circuits that are used for X4 programming for an embodiment of X3 programming presents technical challenges for smart verify when X3 programming. With reference to FIG. 7A3 it is noted that eight of the sixteen X4 states are used and eight of the sixteen X4 states are unused in the X3 programming mode. As a result, some of the states in the X3 mode follow state from the X4 mode that is not used in the X3 mode. For example, the B-state (corresponding to S8) follows S7 from the X4 mode. The fact that S7 is not used in the X3 mode presents a technical challenge for smart verify of the B-state in an X3 programming mode based on an X4 programming algorithm. Also note that the D-state (corresponding to S12) follows S11 from the X4 mode. The fact that S11 is not used in the X3 mode presents a technical challenge in smart verify of the D-state in an X3 programming mode based on an X4 programming algorithm.

In one embodiment, the system will use a smart verify to determine which PV loop to start verification of a particular state in the X3 mode if the particular state follows a used state from the X4 mode. For example, with reference to FIG. 7A3, the C, E, F, and G states each immediately follow a used state from the X4 mode. Thus, the system may skip verify of the C-state until a pre-determined number of memory cells have a Vt above VvB, skip verify of the E-state until a pre-determined number of memory cells have a Vt above VvD, skip verify of the F-state until a pre-determined number of memory cells have a Vt above VvE, and skip verify of the G-state until a pre-determined number of memory cells have a Vt above VvF. The term "Smart PCV" is used in FIG. 7A3 to point out X3 states for which verification may be performed in this manner.

In embodiment, if the particular state in the X3 mode follows an unused state in the X4 mode, then the system may use a different test to determine which PV loop to begin verifying. For example, the system may begin to verify the D-state after a pre-determined number of program loops since verification of the C-state has begun. Doing so avoids the need to base the determination on a count of the number of memory cells having a Vt above VvC, which simplifies the programming logic in an embodiment that uses at least some of the X4 programming logic for X3 programming. The D-state in FIG. 7A3 is labeled with "Manual PCV" to indicate that D-state verification begins after a pre-determined number of program loops after verification of the C-state started.

In some cases, using the smart verify is important enough to use smart verify even if the particular state follows an unused state from the X4 mode. The B-state in FIG. 7A3 is such an example. In one embodiment, the memory system will skip verify of the B-state until a pre-determined number of memory cells have a Vt above VvA. In one embodiment, verification, in combination with smart verify of the B-state, verification of the states above the B-state will begin a pre-determined number of PV loops after verification of the preceding state has begun. For example, verification of the C-state may start one PV loop after verification of the B-state begins, verification of the D-state may start one PV loop after verification of the C-state begins, etc. Starting verification a pre-determined number of PV loops after verification of the immediately preceding state is referred to herein as Manual PCV. Thus, it is not required that the C, D, E, F, and G states have smart verify. Instead, Manual PCV could be used for the C, D, E, F, and G states, in combination with smart PCV of the B-state. In this present example, smart verify is only used for the B-state, which simplifies modifications to the X4 programming logic circuits in order to support efficient and accurate verify in the X3 programming mode. For example, the number of verify operations can be kept low without a significant risk of over-programming.

FIG. 8 is a flowchart of one embodiment of a process 800 of state dependent smart verify in a memory system that uses both an X3 program mode and an X4 program mode. In one embodiment, the process 800 is used to program NAND memory cells. In one embodiment, one set of blocks is used for TLC data and another set of blocks is used for QLC data. Therefore, it is not required that the same group of memory cells be programmed in both the X3 mode and the X4 mode. However, optionally, the same group of memory cells could at different times store TLC data and QLC data. In one embodiment, the process 800 is performed by one or more control circuits (e.g., system control logic 260, column control circuitry 210, row control circuitry 220) of memory die 200. In one embodiment, the process 800 is performed by one or more control circuits (e.g., system control logic 260, column control circuitry 210, row control circuitry 220) of control die 211. The steps in process 800 are depicted in a particular order for convenience of description.

Step 802 includes programming a first group of the memory cells in memory structure 202 using a four-bit code. One example of a four-bit code is depicted in FIG. 7A1. Step 802 may also include performing smart verify. The four-bit code has sixteen states (e.g., S0-S15) and four pages (eg., LP, MP, UP, TP). In an embodiment of smart verify of step 802 verification of a particular state begins a pre-determined number of PV loops after a certain number of cell have a Vt above a verify voltage for the state that immediately precedes the particular state. The states are ordered based on threshold voltage. By a first state immediately preceding a second state it is meant that the verify voltage of the first state is the next lowest in threshold voltage.

Step 804 includes programming a second group of the memory cells in memory structure 202 using a three-bit code. One example of a four-bit code is depicted in FIG. 7A2. The three-bit code has eight of the sixteen states of the four-bit code. For example, in FIG. 7A2 the three-bit code has states S0, S1, S8, S9, S12, S13, S14, and S15. Those eight states are based on the state from the four-bit code for which an unused page has a default value. In the example of FIG. 7A, the unused page is UP. The states that are used are those for which the UP has a value of 1, in that example. Examples are discussed below in which other states from the four-bit code are used in the three-bit code.

Step 804a includes determining which PV loop to being to verify each state of a set of the states in the three-bit code. In one embodiment, step 804a performs what is referred to herein as a smart PVC. In an embodiment of a smart PVC for a particular state, the memory system will count how many memory cells have a Vt above a verify voltage immediately below the particular state. Verification begins the next PV loop (or some other predetermined number of PV loops) after the count reaches a certain number. For example, verification for the E-state may begin the next PV loop after a certain number of cells have a Vt above the verify voltage for the D-state. Step 804 is to begin verification of each particular state on the PV loop determined in step 804a. Once verification for a particular state has begun, that particular state will be verified each PV loop until it is determined that the memory cells targeted for that particular state have completed programming (step 804c).

Figure 9:
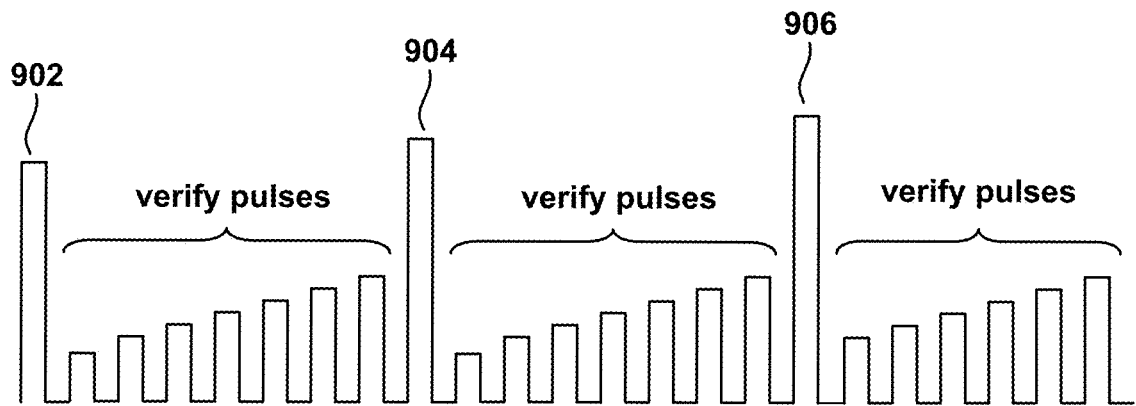
FIG. 9 depicts one possible scheme for verifying memory cells.

FIG. 9 depicts one possible scheme for verifying memory cells. The technique includes verifying all state that have not yet passed verify after each program pulse. The example is for TLC in which seven states are verified after pulse 902 and seven states are verified after pulse 904. For the sake of example, the A-state was verified as having finished programming after pulse 904, and is not verified after pulse 906. This technique will lead to a very high number of program pulses and hence will be slow and consume substantial current and/or power.

Figure 10A:
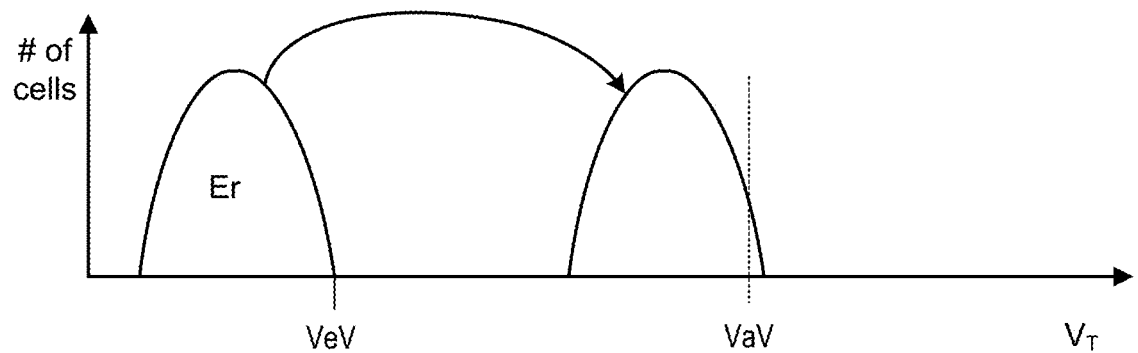
FIGS. 10A and 10B show a portion of the programming process of two different dies that program at different speeds.
Figure 10B:
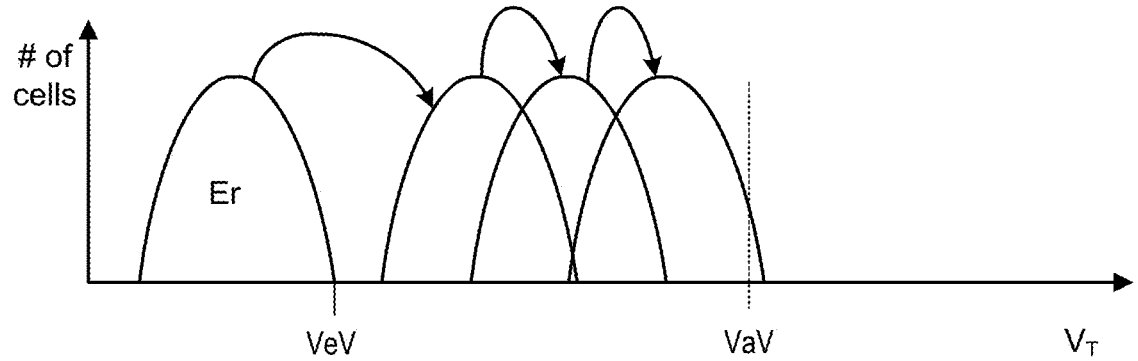
Figure 11:
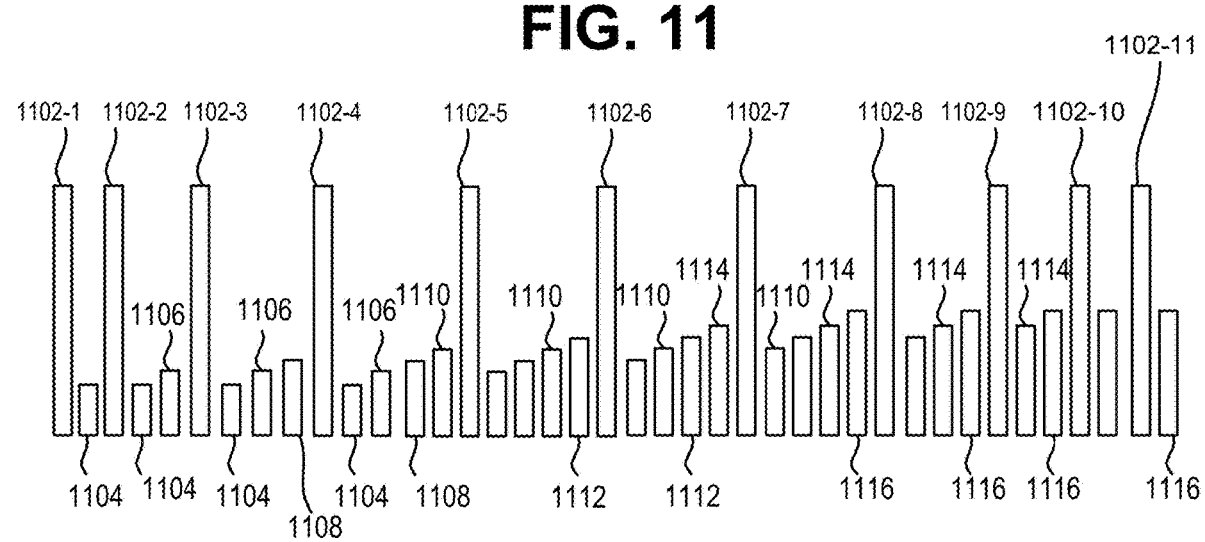
FIG. 11 depicts a possible scheme that will prevent over-programming regardless of whether there is a slower or faster programming die.

A possible advancement over the technique depicted in FIG. 9 is to skip verify of some of the higher Vt states on the earlier PV loops. However, one of the technical challenges of such skipping is that there can be considerable die to die variation in programming speed. FIGS. 10A and 10B show a portion of the programming process of two different dies, which program at different speeds. FIG. 10A shows a case in which after a single program pulse some of the memory cells have a Vt above VaV (the A-state verify voltage). FIG. 10B shows a case in which it takes three program pulses for any of the memory cells have a Vt above VaV. Consider a scheme in which verification of the B-state were to be skipped for the first PV loop and started on the second PV loop. Such as scheme could work well for the faster programming case of FIG. 10A. However, such as scheme would verify earlier than necessary for the case of FIG. 10B. Now, consider a scheme in which verification of the B-state were to be skipped for the first three PV loops and started on the fourth PV loop. Such as scheme could work well for the faster slower case of FIG. 10B. However, such as scheme could result in over-programming for the case in FIG. 10A. Since over-programming can lead to errors that cannot be corrected by ECC, over-programming should be avoided. FIG. 11 depicts a possible scheme that will prevent over-programming regardless of whether there is a slower or faster programming die. FIG. 11 depicts eleven program pulses 1102-1 to 1102-11. In FIG. 11, verification of the A-state starts after the first program pulse 1102-1, as indicated by verification pulse 1104; verification of the B-state starts after the second program pulse 1102-2, as indicated by verification pulse 1106; verification of the C-state starts after the third program pulse 1102-3, as indicated by verification pulse 1108; verification of the D-state starts after the fourth program pulse 1102-4, as indicated by verification pulse 1110; verification of the E-state starts after the fifth program pulse 1102-5, as indicated by verification pulse 1112; verification of the F-state starts after the sixth program pulse 1102-6, as indicated by verification pulse 1114; and verification of the G-state starts after the seventh program pulse 1102-7, as indicated by verification pulse 1116. Verification for a state may stop after all but a few cells have reached that state. The technique depicted in FIG. 11 may be relatively simple to implement due to each state's verification starting at a pre-determined PV loop. However, the technique depicted in FIG. 11 will have unnecessary verifies for a faster programming die, such as the example in FIG. 10A. In practice, a high percentage of dies may program relatively fast as in the example in FIG. 10A.

Figure 12:
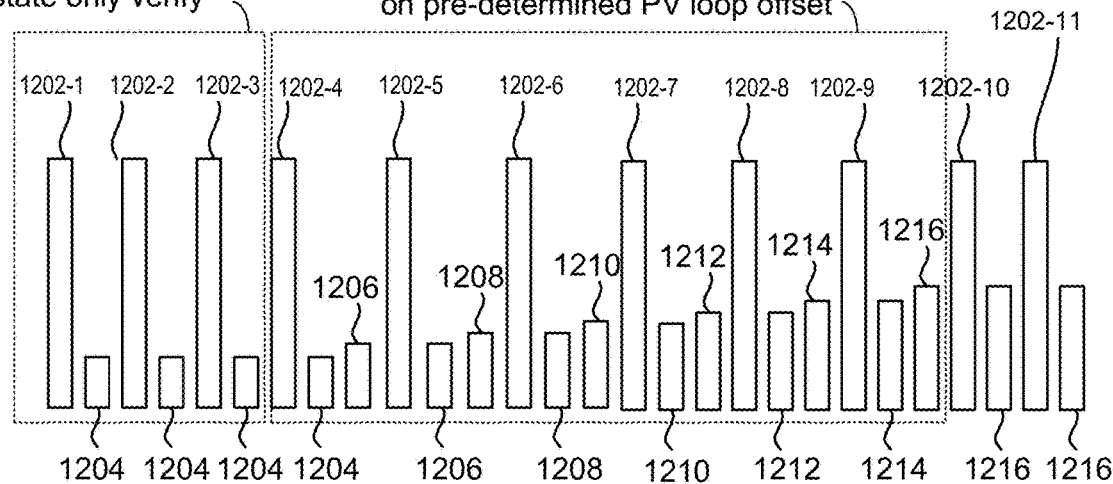
FIG. 12 depicts one embodiment of a smart verification scheme for X3 programming.

FIG. 12 depicts one embodiment of a smart verification scheme for X3 programming. The scheme may be performed by logic circuits on a die that also perform X4 programming. Moreover, the smart verification scheme permits a substantial portion of the X4 programming logic circuits to be used for X3 programming. FIG. 12 depicts eleven program pulses 1202-1 to 1202-11. One embodiment of smart verification depicted in FIG. 12 will verify only the A-state for 1 to n program/verify (PV) loops (pulses 1204). Therefore, verify of the B-state through the G-states are skipped for 1 to n PV loops, which reduces the total number of verify operations. The determination is based on a count of memory cells having a Vt above the A-state verify level. For the sake of example, n is depicted as being 3 PV loops in FIG. 12, but n could be lower or higher than 3. After a certain number of memory cells have a Vt above the A-state verify then B-state verify (pulses 1206) begins in the next PV loop. Verification for the C-state through the G-state begins a pre-determined number of PV loops after verification starts for the immediately preceding state. For example, verification for the C-state (pulses 1208) begins 1 PV loop after verification of the B-state begins, verification for the D-state (pulses 1210) begins 1 PV loop after verification of the C-state begins, verification for the E-state (pulses 1212) begins 1 PV loop after verification of the D-state begins, verification for the F-state (pulses 1214) begins 1 PV loop after verification of the E-state begins, verification for the G-state (pulses 1216) begins 1 PV loop after verification of the F-state begins. In this example, the number of PV loops to wait to begin verification of the next state is one; however, two or more PV loops could be used. Also, it is not required that all states wait the same number of PV loops after verification of the immediately preceding state. A comparison of the examples in FIGS. 11 and 12 show that it each case it took 11 program pulses to complete programming. However, the case in FIG. 11 used 29 verify pulses, whereas the case in FIG. 12 used only 17 verify pulses. Therefore, the embodiment of FIG. 12 represents a substantial savings in time, current and/or power relative to the example in FIG. 11. Moreover, due to the counting of memory cells having a Vt above the A-state verify level the embodiment of FIG. 12 does not present a significant risk of overprogramming.

Figure 13:
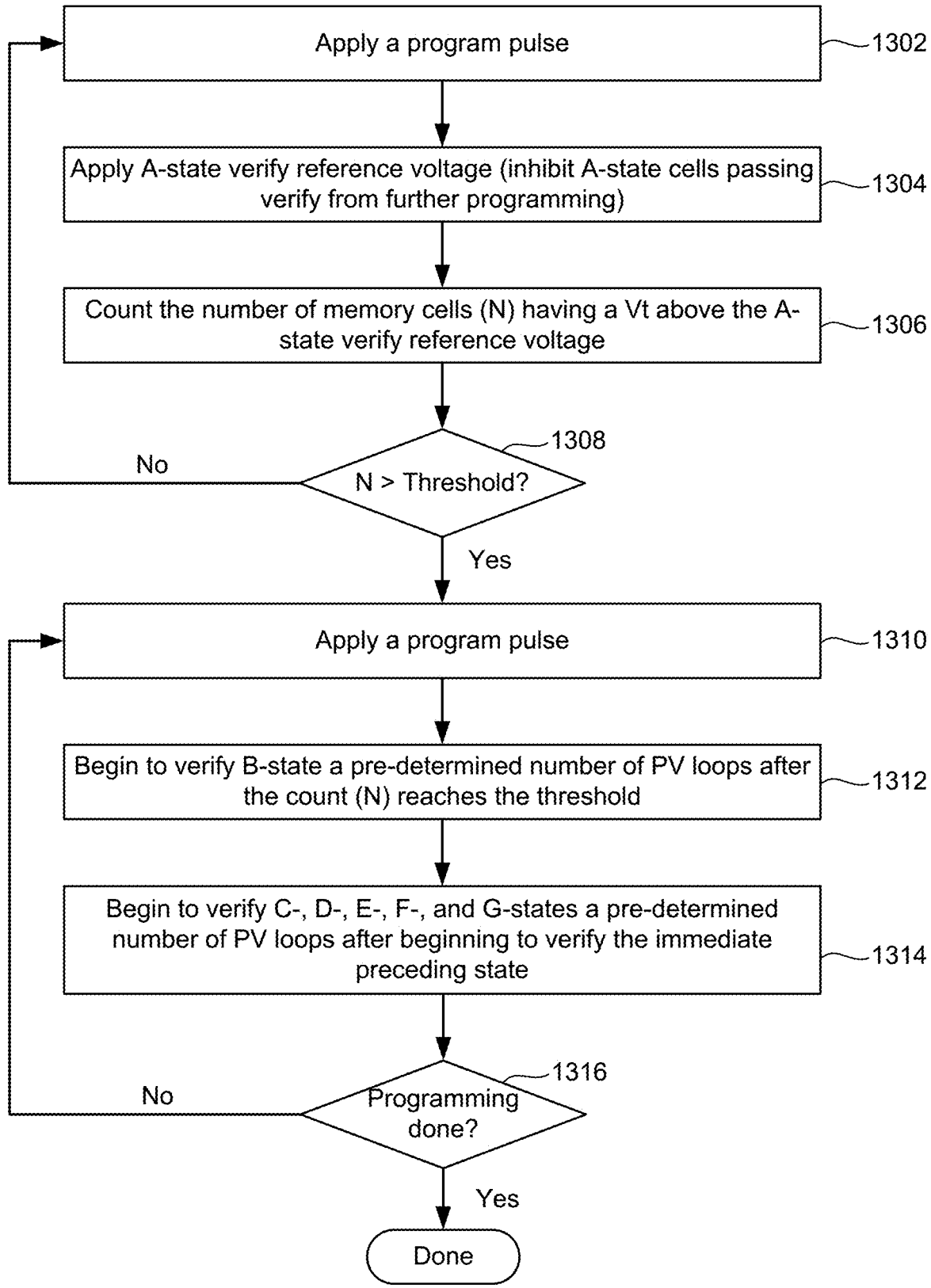
FIG. 13 is a flowchart of one embodiment of a process that combines smart PVC and manual PVC for X3 programming.

The embodiment depicted in FIG. 12 may be referred to as using smart PVC for the B-state and manual PVC for the C-, D-, E-, F- and G-states. Hence, the embodiment combines smart PVC and manual PVC. FIG. 13 is a flowchart of one embodiment of a process 1300 that combines smart PVC and manual PVC for X3 programming. The process 1300 provides further details for one embodiment of step 804 in FIG. 8. Step 1302 includes applying a program pulse to a selected word line connected to the memory cells to be programmed. The memory cells could be just those in one of the sub-blocks that are connected to the selected word line. The memory cells may be referred to herein as a physical page of memory cells. In an embodiment, the physical page has about 16 Kbyte of memory cells.

Step 1304 includes applying an A-state verify reference voltage to the selected word line. Step 1304 also includes inhibiting an cells that are targeted for the A-state from receiving further programming if their Vt is at the A-state verify reference voltage.

Step 1306 includes counting the number of memory cells (N) having a Vt above the A-state verify reference level. Step 1308 is a determination of whether the number of memory cells (N) is greater than a threshold number. The threshold number may vary by implementation. For example, the threshold number about 10 cells, about 100 cells or some other number. If the number of memory cells (N) has not yet reached the threshold, then the process returns to step 1302 to apply another program pulse. When the number of memory cells (N) reaches the threshold, then the process goes to step 1310 to apply another program pulse.

Steps 1312 and 1314 include beginning to verify the B- to G-states during the programming process. Step 1312 includes beginning to verify the B-state a predetermined number of PV loops after the count (N) reaches the threshold. This is depicted in FIG. 12 as starting on the fourth PV loop, but could being as early as the second PV loop or after the fourth PV loop, depending on the count (N).

Step 1314 includes starting to verify the C-, D-, E-, F-, and G-states a predetermined number of PV loops after verification started for the immediately preceding state. Another way to state the condition for starting verification for a particular state is that it begins a pre-determined number of PV loops after the number of memory cells (N) reaches the threshold number. However, note that this only requires that the count be made for the A-state verify level, which greatly simplifies the design of the logic circuitry. Step 1316 includes a test of whether programming is done (see step 618 in FIG. 6, for example). The process loops through steps 1310-1316 until programing is complete.

Figure 14:
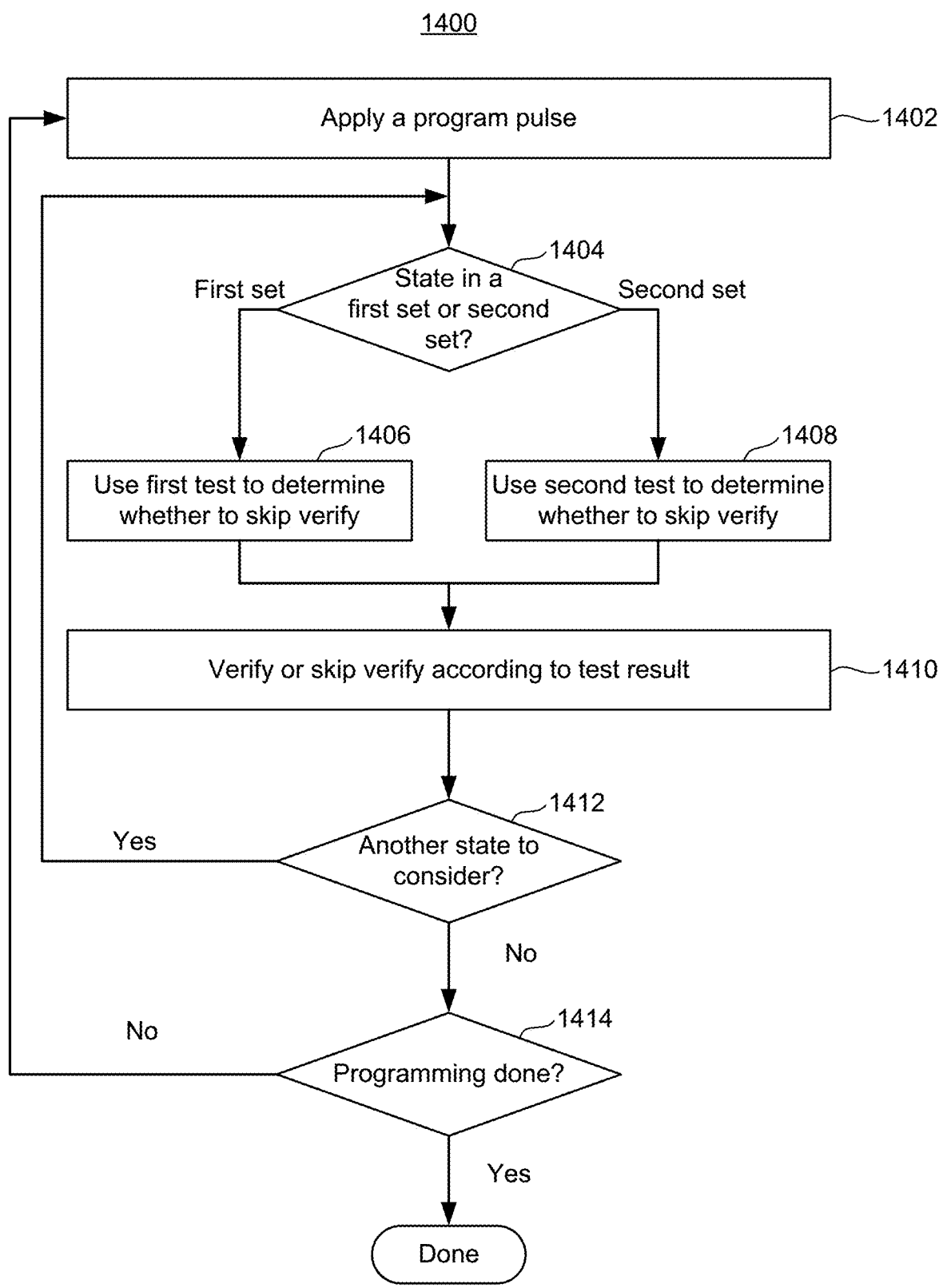
FIG. 14 is a flowchart of one embodiment of a process of state dependent smart verify for X3 programming.

One embodiment includes a state dependent smart verify for X3 programming. For example, smart PVC can be used for a first set of X3 states and manual PVC can be used for a second set of X3 states. FIG. 14 is a flowchart of one embodiment of a process 1400 of state dependent smart verify for X3 programming. The process 1400 provides further details for one embodiment of step 804 in FIG. 8. Step 1402 includes applying a program pulse to a selected word line connected to the memory cells to be programmed. The memory cells could be just those in one of the sub-blocks that are connected to the selected word line.

Steps 1404-1410 describe verifying or skipping verifying for a particular state. Steps 1404-1410 may be performed for each state that has not yet completed verification. Step 1404 is a determination of whether the particular state is in a first set of X3 states or a second set of X3 states. The first set are those for which a first test will be performed to determine whether to verify or skip verify. The second set are those for which a second test will be performed to determine whether to verify or skip verify. In one embodiment, the first test is a smart PVC test and the second test is a manual PVC test. In one embodiment, the first set of states includes all states that follow a used state in the four bit coding. In one embodiment, the second set of states include states that follow an unused state in the four bit coding, but do not include any states that follow a used state in the four bit coding. In one embodiment, the B-state is in the first set regardless of whether the B-state follows a used state or an unused state in the four-bit code. A number of examples will be described below to further elaborate.

If the particular state is in the first set than the first test is used to determine whether to verify or skip verity (step 1406). If the particular state is in the second set than the second test is used to determine whether to verify or skip verity (step 1408). Step 1410 includes either verifying or skipping verify based on the test result. Step 1412 includes a determination of whether there is another state to consider. If so, steps 1404-1410 are repeated for the next state. After the verifies for this PV loop are performed, a determination is made in step 1414 of whether programming is complete. If not, the next PV loop is started in step 1402.

Figure 15:
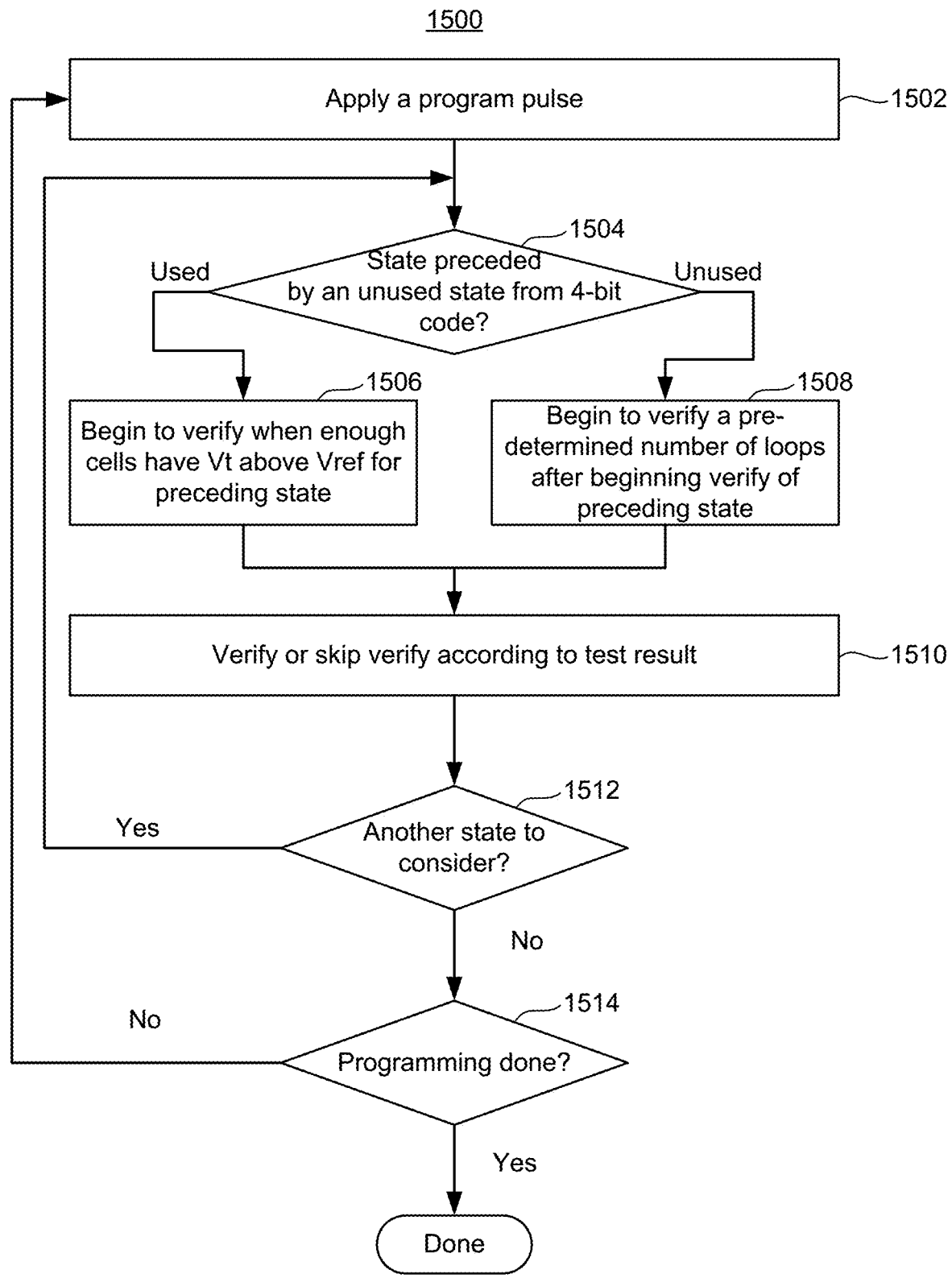
FIG. 15 is a flowchart of another embodiment of a process of state dependent smart verify for X3 programming.

FIG. 15 is a flowchart of another embodiment of a process 1500 of state dependent smart verify for X3 programming. The process 1500 provides further details for one embodiment of step 804 in FIG. 8. Step 1502 includes applying a program pulse to a selected word line connected to the memory cells to be programmed. The memory cells could be just those in one of the sub-blocks that are connected to the selected word line.

Steps 1504-1510 describe verifying or skipping verifying for a particular state. Step 1504 is a determination of whether the particular state preceded by an unused state from the 4-bit code. If so, the system determines, in step 1506, that verification begins when enough cells have a Vt above the verify reference for the immediately preceding state.

If the state is preceded by an unused state then the system determines, in step 1508, that verification begins a predetermined number of PV loops after beginning to verify the immediately preceding state. In one embodiment, an exception is made for the B-state, wherein the B-state is tested as in step 1506 even if the B-state follows an unused state.

Step 1510 includes either verifying or skipping verify based on the test result. Step 1512 includes a determination of whether there is another state to consider. If so, steps 1504-1510 are repeated for the next state. After the verifies for this PV loop are performed, a determination is made in step 1514 of whether programming is complete. If not, the next PV loop is started in step 1512.

As has been described herein, in some embodiments, the memory system determines whether to use a smart PCV or a manual PCV based on whether the X3 state is preceded by X4 state that is used or is not used. In some embodiments, X3 states that are preceded by used X4 states receive smart PCV, whereas X3 states that are preceded by unused X4 states may receive manual PCV. However, in one embodiment, an exception is made for the B-state, which may receive smart PCV even if it is preceded by an unused X4 state. A number of different 4-bit codes and corresponding 3-bit codes will now be discussed to illustrate.

In the embodiment depicted in FIGS. 7A1-7A4, a TLC gray code is generated from a QLC gray code by setting all bits of UP to 1. As described above, in embodiments a TLC gray code is generated from a QLC gray code by setting all bits of one of LP, MP, UP and TP to 1 or 0. Thus, in an alternative embodiment, a TLC gray code may be generated from a QLC gray code by setting all bits of UP=0. In an embodiment, a control circuit (e.g., one or more of system control logic 260, read/write circuits 225, row decoder 222 and column decoder 212) sets UP=0.

For example, FIG. 16B1 is a table of an example QLC gray code 1600*b*1 used to represent sixteen data states, and shows in dashed line all data states with UP=0. FIG. 16B2 is a table of an example TLC gray code 1600*b*2 which may be generated from the example QLC gray code 1600*b*1 of FIG. 16B1 by setting UP=0. That is, UP=0 for QLC data states S2-S7 and S10-S11. User data is input as three pages of data to LP, MP and TP, as shown in FIG. 16B2.

FIG. 16B3 depicts an embodiment of threshold voltage Vth distributions for an eight-state memory device in which each memory cell stores three bits of data, programmed using example TLC gray code 1600*b*2 generated from the example QLC gray code 1600*b*1 of FIG. 16B1 with UP=0. As depicted in the example, states S0-S1, S8-S9 and S12-S15 have no memory cells assigned to those states. Thus, the following 8 states remain: S2, S3, S4, S5, S6, S7, S10 and S11, which are assigned as TLC states "Er," "A,", "B," "C," "D," "E," "F," and "G," respectively.

In an embodiment, one of the data latches (e.g., the UP data latch) is forced to a value of 0, and then the X4 logic on the memory die 200 or control die 211 implements a QLC program to program memory cells as TLC memory cells. Instead of 16 data states, 8 data states will result, such as the example threshold voltage Vth distribution depicted in FIG. 16B3.

Although the threshold voltage Vth distribution FIG. 16B3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv2, Vv3, Vv4, Vv5, Vv6, Vv7, Vv10 and Vv11 of the 8 programmed data states S2, S3, S4, S5, S6, S7, S10 and S11, respectively, so that the threshold voltage Vth distribution is more evenly spaced, such as in the example threshold voltage Vth distribution depicted in FIG. 16B4.

FIG. 16B3 shows that in an embodiment smart PCV is used for the B, C, D, E, and G states because they each follow a used state in the 4-bit coding. However, manual PCV is used in an embodiment for the F-state because it follows an unused state (S9) from the 4-bit coding.

FIGS. 16C1-16C4 depict yet another alternative embodiment in which a TLC gray code is generated from a QLC gray code by setting all bits of TP=1. In an embodiment, a control circuit (e.g., one or more of system control logic 260, read/write circuits 225, row decoder 222 and column decoder 212) sets TP=1.

FIG. 16C1 is a table of an example QLC gray code 1600*c*1 used to represent sixteen data states, and shows in dashed line all data states with TP=1. FIG. 16C2 is a table of an example TLC gray code 1600*c*2 which may be generated from the example QLC gray code 1600*c*1 of FIG. 16C1 by setting TP=1. That is, TP=1 for QLC data states S0, S3-S6, and S13-S15. User data is input as three pages of data to LP, MP and TP, as shown in FIG. 16C2.

FIG. 16C3 depicts an embodiment of threshold voltage Vth distributions for an eight-state memory device in which each memory cell stores three bits of data, programmed using example TLC gray code 1600*c*2 generated from the example QLC gray code 1600*c*1 of FIG. 16C1 with TP=1. As depicted in the example, states S1-S2 and S7-S12 have no memory cells assigned to those states. Thus, the following 8 states remain: S0, S3, S4, S5, S6, S13, S14 and S15, which are assigned as TLC states "Er," "A,", "B," "C," "D," "E," "F," and "G," respectively.

In an embodiment, one of the data latches (e.g., the TP data latch) is forced to a value of 1, and then the X4 logic on the memory die implements a QLC program to program memory cells as TLC memory cells. Instead of 16 data states, 8 data states will result, such as depicted in the example threshold voltage Vth distribution FIG. 16C3.

Although the threshold voltage Vth distribution FIG. 16C3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv3, Vv4, Vv5, Vv6, Vv13, Vv14 and Vv15 of the 8 programmed data states S3, S4, S5, S6, S13, S14 and S15, respectively, so that the threshold voltage Vth distribution is more evenly spaced, such as in the example threshold voltage Vth distribution depicted in FIG. 16C4.

FIG. 16C3 shows that in an embodiment smart PCV is used for the B, C, D, F, and G states because they each follow a used state in the 4-bit coding. However, manual PCV is used in an embodiment for the E-state because it follows an unused state (S12) from the 4-bit coding.

FIGS. 16D1-16D4 depict still another alternative embodiment in which a TLC gray code is generated from a QLC gray code by setting all bits of TP=0. In an embodiment, a control circuit (e.g., one or more of system control logic 260, read/write circuits 225, row decoder 222 and column decoder 212) sets TP=0.

FIG. 16D1 is a table of an example QLC gray code 1600d1 used to represent sixteen data states, and shows in dashed line all data states with TP=0. FIG. 16D2 is a table of an example TLC gray code 1600d2 which may be generated from the example QLC gray code 1600d1 of FIG. 16D1 by setting TP=0. That is, TP=0 for QLC data states S1-S2 and S7-S12. User data is input as three pages of data to LP, MP and TP, as shown in FIG. 16D2.

FIG. 16D3 depicts an embodiment of threshold voltage Vth distributions for an eight-state memory device in which each memory cell stores three bits of data, programmed using example TLC gray code 1600d2 generated from the example QLC gray code 1600d1 of FIG. 16D1 with TP=0. As depicted in the example, states S0, S3-S6 and S13-S15 have no memory cells assigned to those states. Thus, the following 8 states remain: S1, S2, S7, S8, S9, S10, S11 and S12, which are assigned as TLC states "Er," "A,", "B," "C," "D," "E," "F," and "G," respectively.

In an embodiment, one of the data latches (e.g., the TP data latch) is forced to a value of 0, and then the X4 logic on the memory die implements a QLC program to program memory cells as TLC memory cells. Instead of 16 data states, 8 data states will result, such as depicted in FIG. 16D3.

Although the threshold voltage Vth distribution FIG. 16D3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv1, Vv2, Vv7, Vv8, Vv9, Vv10, Vv11 and Vv12 of the 8 programmed data states S1, S2, S7, S8, S9, S10, S11 and S12, respectively, so that the threshold voltage Vth distribution is more evenly spaced, such as in the example threshold voltage Vth distribution depicted in FIG. 16D4.

FIG. 16D3 shows that in an embodiment smart PCV is used for the C, D, E, F, and G states because they each follow a used state in the 4-bit coding. The B-state follows an unused state (S6). In one embodiment, an exception is made for the B-state and smart PCV is used despite the B-state following an unused state. Optionally, manual PVC could be used for the B-state because it follows an unused X4 state.

FIGS. 16E1-16E4 depict yet another alternative embodiment in which a TLC gray code is generated from a QLC gray code by setting all bits of MP=1. In an embodiment, a control circuit (e.g., one or more of system control logic 260, read/write circuits 225, row decoder 222 and column decoder 212) sets MP=1.

FIG. 16E1 is a table of an example QLC gray code 1600e1 used to represent sixteen data states, and shows in dashed line all data states with MP=1. FIG. 16E2 is a table of an example TLC gray code 1600e2 which may be generated from the example QLC gray code 1600e1 of FIG. 16E1 by setting MP=1. That is, MP=1 for QLC data states S0-S3, S6-S8 and S15. User data is input as three pages of data to LP, MP and TP, as shown in FIG. 16E2.

FIG. 16E3 depicts an embodiment of threshold voltage Vth distributions for an eight-state memory device in which each memory cell stores three bits of data, programmed using example TLC gray code 1600e2 generated from the example QLC gray code 1600e1 of FIG. 16E1 with MP=1. As depicted in the example, states S4-S5 and S9-S14 have no memory cells assigned to those states. Thus, the following 8 states remain: S0, S1, S2, S3, S6, S7, S8 and S15, which are assigned as TLC states "Er," "A,", "B," "C," "D," "E," "F," and "G," respectively.

In an embodiment, one of the data latches (e.g., the MP data latch) is forced to a value of 1, and then the X4 logic on the memory die implements a QLC program to program memory cells as TLC memory cells. Instead of 16 data states, 8 data states will result, such as depicted in FIG. 16E3.

Although the threshold voltage Vth distribution FIG. 16E3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv1, Vv2, Vv3, Vv6, Vv7, Vv8 and Vv15 of the 8 programmed data states S1, S2, S3, S6, S7, S8 and S15, respectively, so that the threshold voltage Vth distribution is more evenly spaced, such as in the example threshold voltage Vth distribution depicted in FIG. 16E4.

FIG. 16E3 shows that in an embodiment smart PCV is used for the B, C, E, and F states because they each follow a used state in the 4-bit coding. Manual PVC is used for the D state because it follows an unused X4 state (S5). Manual PVC is also used for the G state because it follows an unused X4 state (S14).

FIGS. 16F1-16F4 depict still another alternative embodiment in which a TLC gray code is generated from a QLC gray code by setting all bits of MP=0. In an embodiment, a control circuit (e.g., one or more of system control logic 260, read/write circuits 225, row decoder 222 and column decoder 212) sets MP=0.

FIG. 16F1 is a table of an example QLC gray code 1600f1 used to represent sixteen data states, and shows in dashed line all data states with MP=0. FIG. 16F2 is a table of an example TLC gray code 1600f2 which may be generated from the example QLC gray code 1600f1 of FIG. 16F1 by setting MP=0. That is, MP=0 for QLC data states S4-S5 and S9-S14. User data is input as three pages of data to LP, MP and TP, as shown in FIG. 16F2.

FIG. 16F3 depicts an embodiment of threshold voltage Vth distributions for an eight-state memory device in which each memory cell stores three bits of data, programmed using example TLC gray code 1600f2 generated from the example QLC gray code 1600f1 of FIG. 16F1 with MP=0. As depicted in the example, states S0-S3, S6-S8 and S15 have no memory cells assigned to those states. Thus, the following 8 states remain: S4, S5, S9, S10, S11, S12, S13 and S14, which are assigned as TLC states "Er," "A,", "B," "C," "D," "E," "F," and "G," respectively.

In an embodiment, one of the data latches (e.g., the MP data latch) is forced to a value of 0, and then the X4 logic on the memory die implements a QLC program to program memory cells as TLC memory cells. Instead of 16 data states, 8 data states will result, such as depicted in FIG. 16F3.

Although the threshold voltage Vth distribution FIG. 16F3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv4, Vv5, Vv9, Vv10, Vv11, Vv12, Vv13 and Vv14 of the 8 programmed data states S4, S5, S9, S10, S11, S12, S13 and S14, respectively, so that the threshold voltage Vth distribution is more evenly spaced, such as in the example threshold voltage Vth distribution depicted in FIG. 16F4.

FIG. 16F3 shows that in an embodiment smart PCV is used for the C, D, E, F and G states because they each follow a used state in the 4-bit coding. The B-state follows an unused state (S8). In one embodiment, an exception is made for the B-state and smart PCV is used despite the B-state following an unused state. Optionally, manual PVC could be used for the B-state because it follows an unused X4 state.

FIGS. 16G1-16G4 depict yet another alternative embodiment in which a TLC gray code is generated from a QLC gray code by setting all bits of LP=1. In an embodiment, a control circuit (e.g., one or more of system control logic 260, read/write circuits 225, row decoder 222 and column decoder 212) sets LP=1.

In particular, FIG. 16G1 is a table of an example QLC gray code 1600g1 used to represent sixteen data states, and shows in dashed line all data states with LP=1. FIG. 16G2 is a table of an example TLC gray code 1600g2 which may be generated from the example QLC gray code 1600g1 of FIG. 16G1 by setting LP=1. That is, LP=1 for QLC data states S0-S4 and S11-S13. User data is input as three pages of data to LP, MP and TP, as shown in FIG. 16G2.

FIG. 16G3 depicts an embodiment of threshold voltage Vth distributions for an eight-state memory device in which each memory cell stores three bits of data, programmed using example TLC gray code 1600g2 generated from the example QLC gray code 1600g1 of FIG. 16G1 with LP=1. As depicted in the example, states S5-S10 and S14-S15 have no memory cells assigned to those states. Thus, the following 8 states remain: S0, S1, S2, S3, S4, S11, S12 and S13, which are assigned as TLC states "Er," "A,", "B," "C," "D," "E," "F," and "G," respectively.

In an embodiment, one of the data latches (e.g., the LP data latch) is forced to a value of 1, and then the X4 logic on the memory die implements a QLC program to program memory cells as TLC memory cells. Instead of 16 data states, 8 data states will result, such as depicted in FIG. 16G3.

Although the threshold voltage Vth distribution FIG. 16G3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv1, Vv2, Vv3, Vv4, Vv11 and Vv13 of the 8 programmed data states S0, S1, S2, S3, S4, S11, S12 and S13, respectively, so that the threshold voltage Vth distribution is more evenly spaced, such as in the example threshold voltage Vth distribution depicted in FIG. 16G4.

FIG. 16G3 shows that in an embodiment smart PCV is used for the B, C, D, F and G states because they each follow a used state in the 4-bit coding. Manual PCV is used for the E state because it follows an unused X4 state (S10).

FIGS. 16H1-16H4 depict still another embodiment in which a TLC gray code is generated from a QLC gray code by setting all bits of LP=0. In an embodiment, control circuit (e.g., one or more of system control logic 260, read/write circuits 225, row decoder 222 and column decoder 212) sets LP=0.

FIG. 16H1 is a table of an example QLC gray code 1600h1 used to represent sixteen data states, and shows in dashed line all data states with LP=0. FIG. 16H2 is a table of an example TLC gray code 1600h2 which may be generated from the example QLC gray code 1600h1 of FIG. 16H1 by setting LP=0. That is, LP=0 for QLC data states S5-S10 and S14-S15. User data is input as three pages of data to LP, MP and TP, as shown in FIG. 16H2.

FIG. 16H3 depicts an embodiment of threshold voltage Vth distributions for an eight-state memory device in which each memory cell stores three bits of data, programmed using example TLC gray code 1600h2 generated from the example QLC gray code 1600h1 of FIG. 16H1 with LP=0. As depicted in the example, states S0-S4 and S11-S13 have no memory cells assigned to those states. Thus, the following 8 states remain: S5, S6, S7, S8, S9, S10, S14 and S15, which are assigned as TLC states "Er," "A,", "B," "C," "D," "E," "F," and "G," respectively.

In an embodiment, one of the data latches (e.g., the LP data latch) is forced to a value of 0, and then the X4 logic on the memory die implements a QLC program to program memory cells as TLC memory cells. Instead of 16 data states, 8 data states will result, such as depicted in FIG. 16H3.

Although the threshold voltage Vth distribution FIG. 16H3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv5, Vv6, Vv7, Vv8, Vv9, Vv10, Vv14 and Vv15 of the 8 programmed data states S5, S6, S7, S8, S9, S10, S14 and S15, respectively, so that the threshold voltage Vth distribution is more evenly spaced, such as in the example threshold voltage Vth distribution depicted in FIG. 16H4.

FIG. 16H3 shows that in an embodiment smart PCV is used for the B, C, D, E and G states because they each follow a used state in the 4-bit coding. Manual PCV is used for the F state because it follows an unused X4 state (S13).

Technology is disclosed herein for a memory system that has smart verify for an X3 program mode. The X3 mode uses a three-bit gray code that is based on a four-bit gray code of an X4 mode. By basing the three-bit gray code on the four-bit gray code, a considerable portion of the logic that is used for X4 programming can also be used for X3 programming. However, since the three-bit gray code only uses eight of the sixteen states from the four-bit gray code, technical challenges arise for verification using the three-bit gray code. In particular, the logic that determines which states to skip verify in an X4 programming mode may be unsuitable to use for skipping verify in an X3 programming mode. Technology is disclosed herein skips verify of states in the X3 programming mode, while still allowing a considerable portion of the programming logic from the X4 programming mode to be used in the X3 programming mode.

In view of the foregoing, a first embodiment includes an one or more control circuits configured to connect to a memory structure comprising non-volatile memory cells, wherein the one or more control circuits are configured to program a first group of the memory cells in the memory structure using a four-bit code having sixteen states and four pages. The one or more control circuits are configured to program a second group of the memory cells in the memory structure using a three-bit code based on three pages of the four pages. The three-bit code includes eight states of the sixteen states of the four-bit code for which an unused page of the four-bit code comprises a default value. The one or more control circuits are configured to begin to verify during programming using the three-bit code, for each particular state of a first set of one or more states of the eight states, during a program-verify loop determined based on whether a number of memory cells having a threshold voltage above a verify voltage for a state that immediately precedes the particular state in threshold voltage is greater than a pre-determined number.

In a second embodiment, in furtherance to the first embodiment, the one or more control circuits are further configured to begin to verify during programming using the three-bit code, for each particular state of a second set of one or more states of the eight states, during a program-verify loop determined based on a pre-determined number of program-verify loops following beginning to verify a state that immediately precedes the particular state in threshold voltage.

In a third embodiment, in furtherance to the first or second embodiments, the eight states includes an erase state, and A-, B-, C-, D-, E-, F-, and G-states in increasing threshold voltages. The first set includes the B-state.

In a fourth embodiment, in furtherance to any of the first to third embodiments, the second set includes the C-, D-, E-, F-, and G-states.

In a fifth embodiment, in furtherance the any of the first to fourth embodiments, the first set comprises all states in the three-bit code that immediately follow a state in the four-bit code that is also used in the three-bit code.

In a sixth embodiment, in furtherance the any of the first to fifth embodiments, the eight states includes an erase state, and A-, B-, C-, D-, E-, -F, and G-states in increasing threshold voltages. The first set includes the B-state whether the B-state follows a state in the four-bit code that is also used in the three-bit code or whether the B-state follows a state in the four-bit code that is not used in the three-bit code.

In a seventh embodiment, in furtherance of any of the first to the sixth embodiments, the second set comprises states in the three-bit code that immediately follow a state in the four-bit code that is not used in the three-bit code, but does not include any state in the four-bit code that is also used in the three-bit code.

In an eighth embodiment, in furtherance to any of the first to seventh embodiments, to program the second group of the memory cells in the memory structure using the three-bit code based on three of the four pages of the four-bit code includes the one or more control circuits being further configured to: load three data pages into a corresponding three sets of data latches associated with memory cells; and load the default value into a fourth set of data latches associated with memory cells, wherein the default value is the same for all data latches in the fourth set of data latches.

In a ninth embodiment, in furtherance to f the eighth embodiment, the one or more control circuits are configured to program the three data pages into the memory cells based on a programming algorithm that considers the three data pages in the corresponding three sets of data latches and the default value in the fourth set of data latches.

One embodiment includes a method for operating non-volatile storage. The method comprises loading three data pages into a corresponding three sets of data latches. The method comprises loading a default value into a fourth set of data latches, wherein the default value is the same for all latches in the fourth set. The method comprises programming the three data pages into a group of memory cells in the non-volatile storage, wherein the three data pages are programmed as eight threshold voltage distributions, that include an A-state and a B-state, including: i) skipping verify of the B-state each program-verify loop before a pre-determined number of memory cells have a threshold voltage above a verify voltage for the A-state; and ii) beginning to verify the B-state on the next program-verify loop after the pre-determined number of memory cells have a threshold voltage above the verify voltage for an A-state.

One embodiment includes a non-volatile storage system comprising a memory structure comprising NAND memory cells and one or more control circuits in communication with the memory structure. The one or more control circuits are configured to program a first group of the NAND memory cells in the memory structure using a four page gray code having sixteen data states. The one or more control circuits are configured to program a second group of the NAND memory cells in the memory structure using a three page gray code based on eight data states of the sixteen data states, wherein the eight data states are ordered consecutively in the three page gray code. The one or more control circuits are configured to determine whether to skip verify for a particular program-verify loop for a first set of one or more data states of the three page gray code based on a first test. The one or more control circuits are configured to determine whether to skip verify for a particular program-verify loop for a second set of one or more data states of the three page gray code based on a second test.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a memory structure comprising non-volatile memory cells, wherein the one or more control circuits are configured to:
program a first group of the memory cells in the memory structure using a four-bit code having sixteen states and four pages;
program a second group of the memory cells in the memory structure using a three-bit code based on three pages of the four pages, wherein the three-bit code includes eight states of the sixteen states of the four-bit code for which an unused page of the four-bit code comprises a default value; and
begin to verify during programming using the three-bit code, for each particular state of a first set of one or more states of the eight states, during a program-verify loop determined based on whether a number of memory cells having a threshold voltage above a verify voltage for a state that immediately precedes the particular state in threshold voltage is greater than a pre-determined number.

2. The apparatus of claim 1, wherein the one or more control circuits are further configured to:
begin to verify during programming using the three-bit code, for each particular state of a second set of one or more states of the eight states, during a program-verify loop determined based on a pre-determined number of program-verify loops following beginning to verify a state that immediately precedes the particular state in threshold voltage.

3. The apparatus of claim 2, wherein:
the eight states includes an erase state, and A-, B-, C-, D-, E-, F-, and G-states in increasing threshold voltages; and
the first set includes the B-state.

4. The apparatus of claim 3, wherein:
the second set includes the C-, D-, E-, F-, and G-states.

5. The apparatus of claim 2, wherein the first set comprises:
all states in the three-bit code that immediately follow a state in the four-bit code that is also used in the three-bit code.

6. The apparatus of claim 5, wherein:
the eight states includes an erase state, and A-, B-, C-, D-, E-, -F, and G-states in increasing threshold voltages; and
the first set includes the B-state whether the B-state follows a state in the four-bit code that is also used in the three-bit code or whether the B-state follows a state in the four-bit code that is not used in the three-bit code.

7. The apparatus of claim 5, wherein the second set comprises:
states in the three-bit code that immediately follow a state in the four-bit code that is not used in the three-bit code, but does not include any state in the four-bit code that is also used in the three-bit code.

8. The apparatus of claim 1 wherein to program the second group of the memory cells in the memory structure using the three-bit code based on three of the four pages of the four-bit code includes the one or more control circuits being further configured to:
load three data pages into a corresponding three sets of data latches associated with memory cells; and
load the default value into a fourth set of data latches associated with memory cells, wherein the default value is the same for all data latches in the fourth set of data latches.

9. The apparatus of claim 8, wherein the one or more control circuits are further configured to:
program the three data pages into the memory cells based on a programming algorithm that considers the three data pages in the corresponding three sets of data latches and the default value in the fourth set of data latches.

* * * * *